United States Patent [19]

Kawate

[11] 4,368,523

[45] Jan. 11, 1983

[54] LIQUID CRYSTAL DISPLAY DEVICE HAVING REDUNDANT PAIRS OF ADDRESS BUSES

[75] Inventor: Keiichi Kawate, Yokohama, Japan

[73] Assignee: Tokyo Shibaura Denki Kabushiki Kaisha, Japan

[21] Appl. No.: 217,093

[22] Filed: Dec. 16, 1980

[30] Foreign Application Priority Data

Dec. 20, 1979 [JP] Japan .............................. 54-164803
Apr. 25, 1980 [JP] Japan .............................. 55-55036
Apr. 25, 1980 [JP] Japan .............................. 55-55037
Apr. 25, 1980 [JP] Japan .............................. 55-55041

[51] Int. Cl.$^3$ .................. G11C 5/06; G11C 8/02; G11C 11/24; H04N 5/74
[52] U.S. Cl. ............................ 365/63; 365/149; 365/189; 365/231; 358/236; 340/784; 29/575
[58] Field of Search ............... 365/230, 231, 200, 201, 365/63, 189, 149, 108, 182, 188; 357/45, 23 C; 29/577 R, 577 C, 575, 571; 340/765, 784; 358/256; 307/246

[56] References Cited

PUBLICATIONS

Schuster, "Multiple Word/Bit Line Redundancy for Semiconductor Memories", *IEEE Journal of Solid-State Circuits*, vol. SC-13, No. 5, Oct. 1978, pp. 698-703.
*Electronics Science 79-84* (Jun. 1979).

*Primary Examiner*—John C. Martin
*Attorney, Agent, or Firm*—Finnegan, Henderson, Farabow, Garrett & Dunner

[57] ABSTRACT

Disclosed is a memory device having a plurality of memory cells arranged in a matrix form; address buses connected to the memory cells and forming respective rows of the matrix; and data buses connected to the memory cells and forming respective columns of the matrix.

The address buses or the data buses are formed by paired bus lines, and bridge lines are formed between one and the other of the paired bus lines.

43 Claims, 24 Drawing Figures

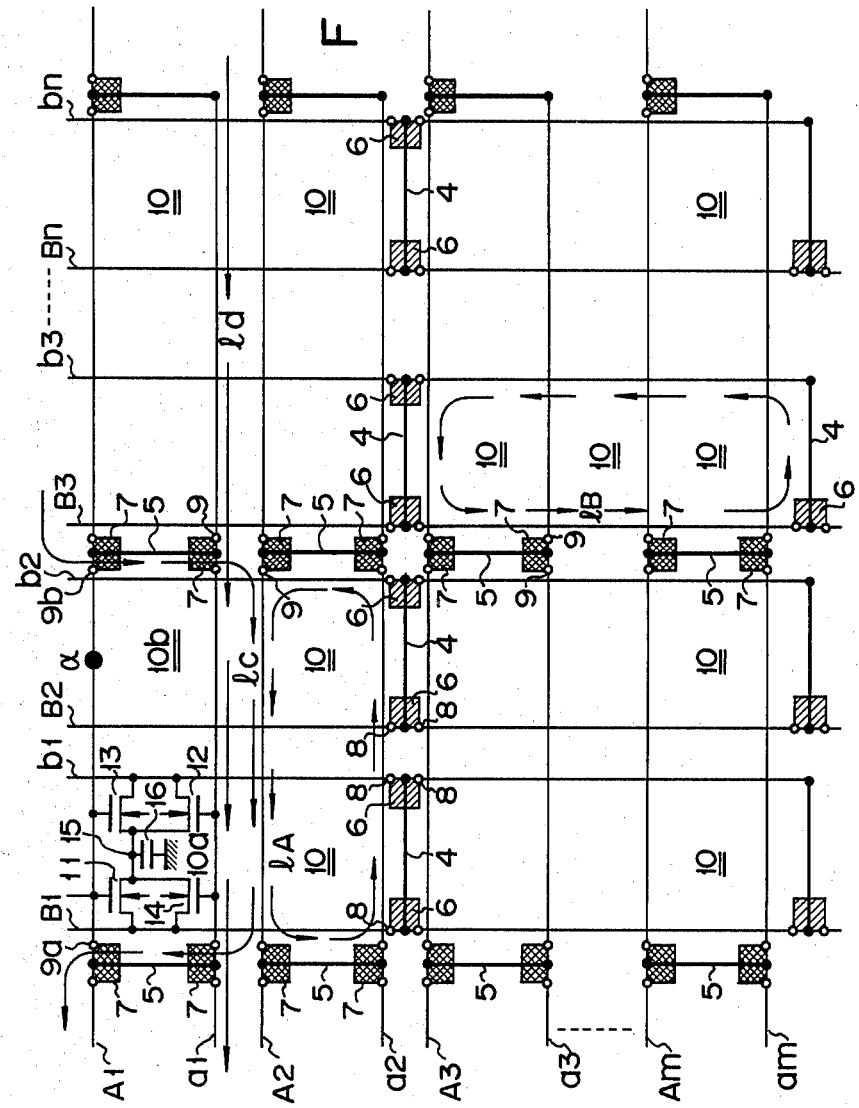

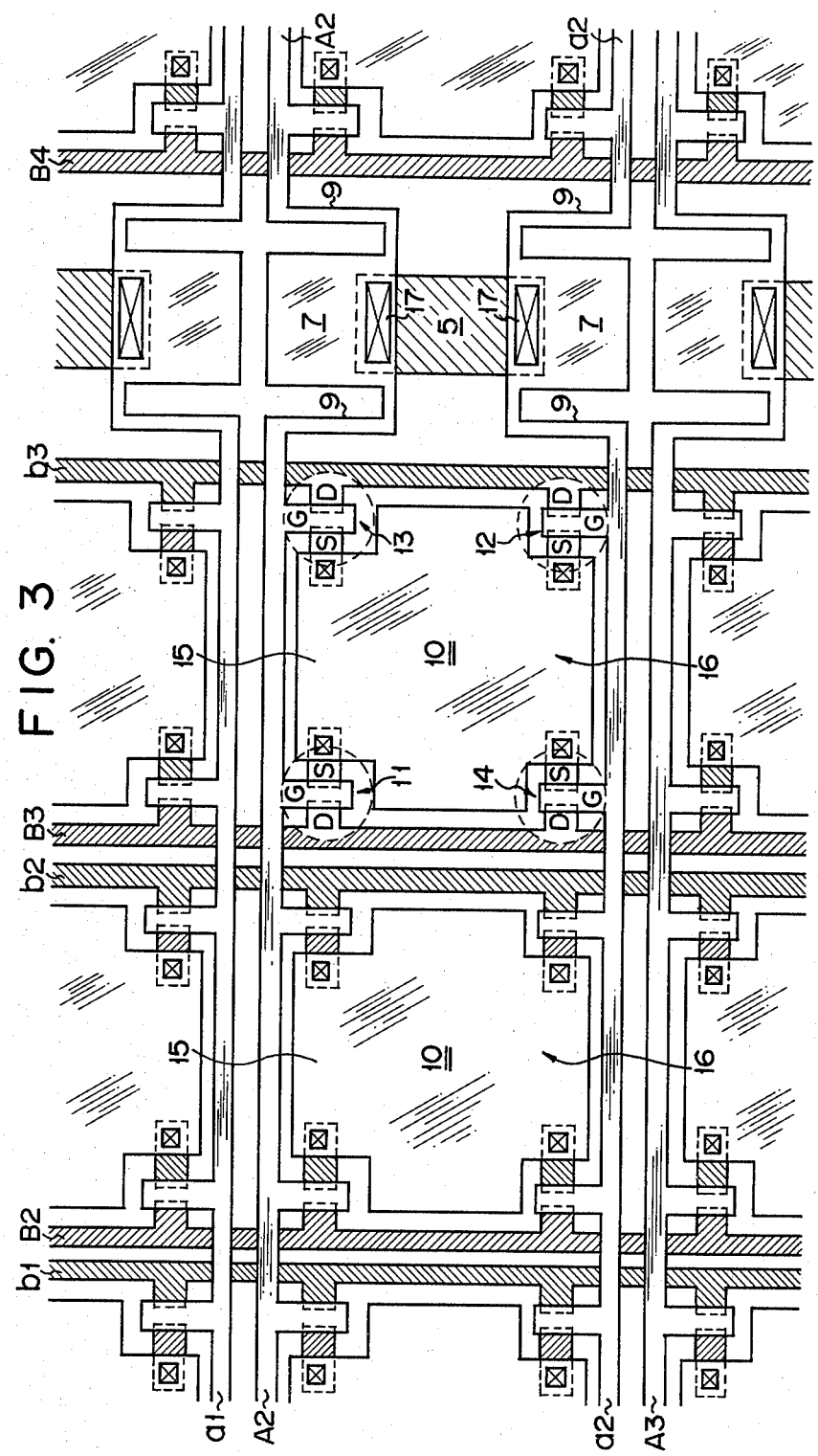

FIG. 11

LIQUID CRYSTAL DISPLAY DEVICE HAVING REDUNDANT PAIRS OF ADDRESS BUSES

The present invention relates to a memory device used in a liquid crystal TV or a plane type display apparatus applying an electrochromic effect, etc. More particularly, the present invention relates to a memory device in which a technique is introduced for lessening degradation of the yield due to defects of an IC mask and/or adherence of contamination in a manufacturing process of an IC memory comprising a large semiconductor pellet.

A laminated type liquid crystal matrix panel is known as a device which is capable of displaying pictures in half tones. Such a matrix panel is disclosed, for example, in "DENPA KAGAKU" ("Radio Wave Science") published in June, 1979 in Japan, pp. 83 to 84. U.S. Pat. No. 3,862,360 is another prior art reference related to the present invention.

This matrix panel has a construction as shown in FIGS. 1A and 1B. A memory device of one transistor/one capacitor per picture element type as shown in FIG. 1A is used as a display IC array 100. At the top part of the IC array, as shown in FIG. 1B, are arranged a ceiling 102, a liquid crystal layer 104, a transparent electrode 106 and a front plane glass 108 to form an LCD (Liquid Crystal Display) matrix panel 110. The capacitor electrodes for constituting picture elements or IC memory cells 1 of the memory device are used as a reflex plate. Video signals (analog) are supplied to data buses B of the IC cells, and scanning signals are supplied to address buses A. For example, if a video signal with a certain potential is at a data bus B1 when an address bus A1 is at high level, a transistor 2 at the matrix position (A1, B1) is rendered conductive in accordance with the potential of the bus B1 and a capacitor 3 at this position is charged to a voltage corresponding to the above-mentioned potential. The liquid crystal portion at the position (A1, B1) is turned on or off according to the potential difference between the capacitor 3 and the transparent electrode 106 opposing this capacitor. When such IC cells or picture elements 1 constitute a 240×240 matrix, a moving picture containing half tones is displayed on the matrix panel according to the signal scanning from an address bus A1 to an address bus A240 and video signals supplied to data buses B1 to B240.

With such a display panel, resolution is better with a greater number of picture elements 1. When a matrix panel of 240×240 (57,600 picture elements) is manufactured for obtaining practical resolution, the display area of this panel becomes as large as 36 mm×48 mm (diagonal size 2.4 inches). Thus, for obtaining a display panel of 2.4 inch size, IC memories having a chip size of over 36 mm×48 mm are required. Only one of such a large memory can be made from a semiconductor wafer of 75 mm (3 inches) diameter. Thus, such an IC memory leads to an extremely high cost, unless the ratio of non-defective units or the yield per wafer is nearly 100%.

With a conventional memory device, each memory cell 1 comprises one transistor 2 and one capacitor 3 as shown in FIG. 1A. Series circuits consisting of the drain-source path of the transistor 2, and the capacitor 3 are connected between the data buses B and the ground voltage line (earth line), and the gates of the transistors 2 are connected to the address buses A. With such a memory device, cases are considered wherein the bus A and/or the bus B is disconnected, the bus A and/or the bus B is short-circuited with other wiring, or the bus A and/or the bus B is short-circuited with the substrate. When such defects are caused, all related memory cells 1 are rendered inoperative. As a result, many picture elements become incapable of performing the display operation.

When a disorder is generated in the IC mask or contamination is introduced in the manufacturing process, short-circuiting and/or a disconnection may be caused in the data bus B or the address bus A. The yield Y of an IC (LSI) with such an accident may be represented by the following equation:

$$Y = \exp(-DA \cdot A) \quad (1)$$

$$Y = \exp(-Dl \cdot l) \quad (2)$$

Equation (1) applies when the IC under consideration for obtaining the yield is planar, and equation (2) applies when the IC is linear. The parameters in equations (1) and (2) indicate the following:

DA: defective area density
Dl: defective line density
A: area scale
l: line length scale It is now assumed that the memory device has the construction described below:

wiring pitch of respective picture element cells: 300 μm (0.3 mm)
arrangement of picture element array: 256×256
size of data bus B: 5 μm wide n+-type diffusion layer wiring
size of address bus A: 5 μm aluminum wiring It is further assumed that Dl of the 5 μm wide n+-type diffusion layer wiring is $1.16 \times 10^{-4}$(mm$^{-1}$) for l=1 mm, and Dl of the 5 μm wide aluminum wiring is $9.93 \times 10^{-5}$(mm$^{-1}$) for l=1 mm.

When the above conditions are applied to the construction shown in FIG. 1A, a yield Y=yoa of the address bus A is obtained from equation (2) as follows:

$$yoa = \exp(-9.93 \times 10^{-5} \times 256 \times 0.3) = 0.9924 \quad (3)$$

Equation (3) indicates a yield value of one for 256 buses of 0.3 mm pitch. A yield Yoa for obtaining all 256 address buses as non-defective units is represented by the following equation:

$$Yoa = [yoa]^{256} = 0.142 \quad (4)$$

Similarly, the yield Y=yod for the data bus B of FIG. 1A may be represented by the following equation:

$$yod = \exp(-1.16 \times 10^{-4} \times 256 \times 0.3) = 0.991 \quad (5)$$

A yield Yod for obtaining all 256 data buses as non-defective units is represented by the following equation:

$$Yod = [yod]^{256} = 0.102 \quad (6)$$

Accordingly, a yield $Yo^T$ obtained for all the buses of the memory device is represented by the following equation:

$$Yo^T = Yoa \cdot Yod = 0.142 \times 0.102 = 0.014 \, (1.4\%) \quad (7)$$

As may be apparent from the above calculation results, the yield becomes extremely low with a memory device having a large pellet size as applied to an LCD panel of 2 to 3 inches. Consequently, the memory device becomes very costly when the conventional construction as shown in FIG. 1A is adopted.

The above description applies to the case when a disconnection or short-circuiting is caused in the buses A and/or B of the memory device. On the other hand, when a data bus driver for driving the data bus B or an address bus driver for driving (scanning) the address bus a is formed on a semiconductor chip on which are also formed the memory cells 1, more problems must be considered. When a disorder has been detected in part of the data bus driver and/or the address bus driver, the memory device as a whole becomes defective even when the respective cells 1 are all functioning normally.

It is assumed that the picture elements of the liquid crystal display panel are of 256×256 array arrangement of 300 μm pitch. Yields of the data bus driver and the address bus driver in such a case may be calculated as follows.

1. Yield of Address Bus Driver Circuit 1-1 Yield at respective word common part (shift register part)
 (a) Assumption:
 *Element number
  $E_{ASR} = 14^{elements/word} \times 256^{word} = 3584^{elements}$
 *Occupying area
  $A_{ASR} = 0.0408^{mm2}/word \times 256^{word} = 10.44^{mm2}$
 *Element density
  $d_{ASR} = 343.3^{elements/mm2}$
 *$\xi = 0.0016$ (1/mm)
 *$\eta = 0.54^{*1}$
 Note:
 *1: Fitting coefficient defined so that $\eta = 1.0$ for an electric calculator manufactured by the C/AL process.

The single channel process is considered and the chance of causing defects is small. The degradation of the yield is considered to be decreased even with the same process defect level. Therefore, it is assumed that the fitting coefficient $\eta$ is proportional to the number of PEP processes and that $$\eta = \frac{6\ PEP}{11\ PEP} = 0.54$$

(b) Yield $$Y_{ASR} = \exp \cdot (-\eta \cdot \xi \sqrt{d_{ASR} \cdot A_{ASR}})$$
$$= 0.846\ (84.6\%)$$

1-2 Yield at respective word independent part (output buffer part)
 (a) Assumption:
 *Element number
  $E_{ADR} = 10^{elements/word} \times 256 = 2560^{elements}$
 *Occupying area
  $A_{ADR} = 0.1506^{mm2/word} \times 256^{word} = 38.55^{mm2}$
 *Element density
  $d_{ADR} = 66.4^{elements/mm2}$
 *$\xi = 0.0016$ (1/mm)
 *$\eta = 0.54$
 (b) Yield $$Y_{ADR} = \exp \cdot (-\eta \cdot \xi \cdot \sqrt{d_{ADR} \cdot A_{ADR}})$$
$$= 0.762\ (76.2\%)$$

1-3 Yield of Address Bus Driver Circuits $$Y_{AP} = (Y_{ASR} \cdot Y_{ADR}) = 0.645\ (64.5\%)$$

2. Yield of Data Bus Driver Circuit 2-1 Yield of respective bit common part (shift register part)
 (a) Assumption:
 *Element number
  $E_{DSR} = 8^{elements/bit} \times 256^{bit} = 2048^{elements}$
 *Occupying area
  $A_{DSR} = 0.0258^{mm2/word} \times 256^{word} = 6.59^{mm2}$
 *Element density
  $d_{DSR} = 310.8^{elements/mm2}$
 *$\xi = 0.0016$ (1/mm)
 *$\eta = 0.54$
 (b) Yield $$Y_{DSR} = \exp \cdot (-\eta \cdot \xi \cdot \sqrt{d_{DSR} \cdot A_{DSR}})$$
$$= 0.9045\ (90.45\%)$$

2-2 Yield of respective bit independent part (sampling and holding/output driver part)
 (a) Assumption:
 *Element number
  $E_{DDR} = 17^{elements/bit} \times 256^{bit} = 4352^{elements}$
 *Occupying area
  $A_{DDR} = (374^{\mu} \times 322)^{\mu/word} \times 256^{word} = 0.1204 \times 256 = 30.83^{mm2}$
 *Element density
  $d_{DDR} = 141.2^{elements/mm2}$
 *$\xi = 0.0016$ (1/mm)
 *$\eta = 0.54$
 (b) Yield $$Y_{DDR} = \exp \cdot (-\eta \cdot \xi \cdot \sqrt{d_{DDR} \cdot A_{DDR}})$$
$$= 0.729\ (72.9\%)$$

2-3 Yied of Data Bus Driver Circuit $$Y_{DP} = (Y_{DSR} \cdot Y_{DDR}) = 0.659\ (65.9\%)$$

3. Yield of Common Part
 From the above,
 (a) Yield of address bus wiring $Y_{AB} = 0.142$
  Yield of data bus wiring $Y_{DB} = 0.102$
 Therefore, the total yield of bus wirings $Y_B = Y_{AB} \cdot Y_{DB}$
$= 0.0145\ (1.45\%)$ (b) Yield of address bus driver circuit $Y_{AP} = 0.645$
  Yield of data bus driver circuit $Y_{DP} = 0.659$
 Therefore, the total yield of bus driver circuits $$Y_p = Y_{AP} \cdot Y_{DP}$$
$$= 0.425\ (42.5\%)$$

(c) Yield of Common Part
  $Y_C = Y_B \cdot Y_P = 0.0062\ (0.62\%)$
Thus, the yields $Y_B$ and $Y_A$ for the bus drivers become about 65% in each case. Therefore, the probability of non-defective units or yield Y, when both the data and address bus drivers are used for the matrix array of conventional construction as shown in FIG. 1A, is represented by the following equation:

$$Y = Y_A \cdot Y_B \approx 0.65 \times 0.65 \approx 0.425 (42.5\%) \quad (8)$$

As has been described, when a memory device of single bus type is used, the yield of the memory cells becomes as low as 1.4%, and in addition, the low yield of the data/address bus drivers results in a lower yield of the memory device.

The present invention has been made in consideration of this and has for its object to provide a memory device which is capable of preventing a lessening of the yield which is generally caused by a defective mask and/or contamination introduced during the manufacturing process.

In order to accomplish the above and other objects, the present invention provides a memory device in which the address bus and/or the data bus are arranged in pairs. With such paired bus lines, the yield of the memory device may be greatly improved. This is because the chances that a disconnection and/or short-circuiting accident is caused in the two bus lines simultaneously is very low. In one embodiment of the present invention, a pair of bus lines bridged with a predetermined interval are used. When a disconnected or short-circuited part, i.e., a defective part, is detected by tesing individual memory devices, the defective part is cut away using a laser beam, etc. Since the other of the pair of bus lines is active even when the one of them is cut away, the cells connected to the bus lines are not rendered inoperative.

In another embodiment of the memory device of the present invention, the address bus driver and/or the data bus driver has a paired block construction. Thus, the bus driver can operate normally even if one of the paired blocks is defective as long as the other is good. The fraction of defective drivers becomes very small as compared with the case in which drivers of single block construction are used.

With the memory device of the present invention, the yield is high since the defective parts may be repaired and the defective products may thus be turned into operable products. Although the number of steps increases for testing and eliminating the defective parts according to the present invention, the improvement in yield outweighs the increase in the number of steps.

This invention can be more fully understood from the following detailed description when taken in conjunction with the accompanying drawings, in which:

FIG. 2 is a circuit diagram of a memory device according to one embodiment of the present invention;

FIG. 3 is a plan view illustrating the case when part of the circuit shown in FIG. 2 is formed into an IC;

FIGS. 10 and 11 are circuit diagrams illustrating a memory device according to another embodiment of the present invention;

Figure 17:
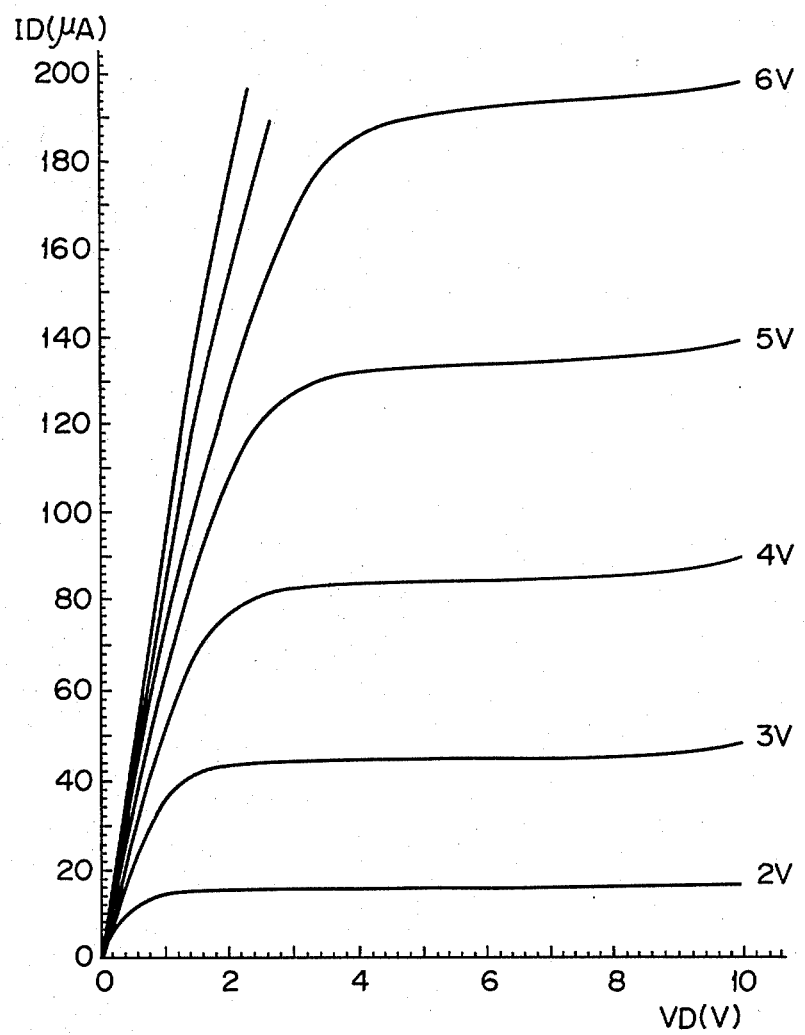
Figure 18:
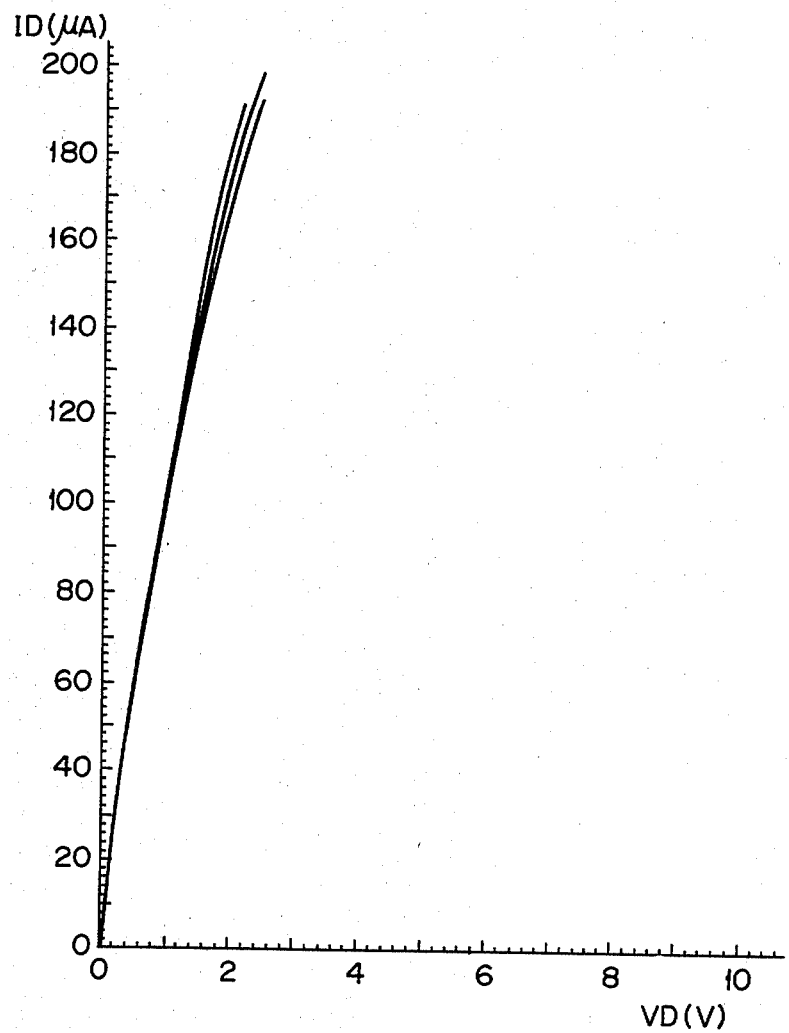
Figure 19:
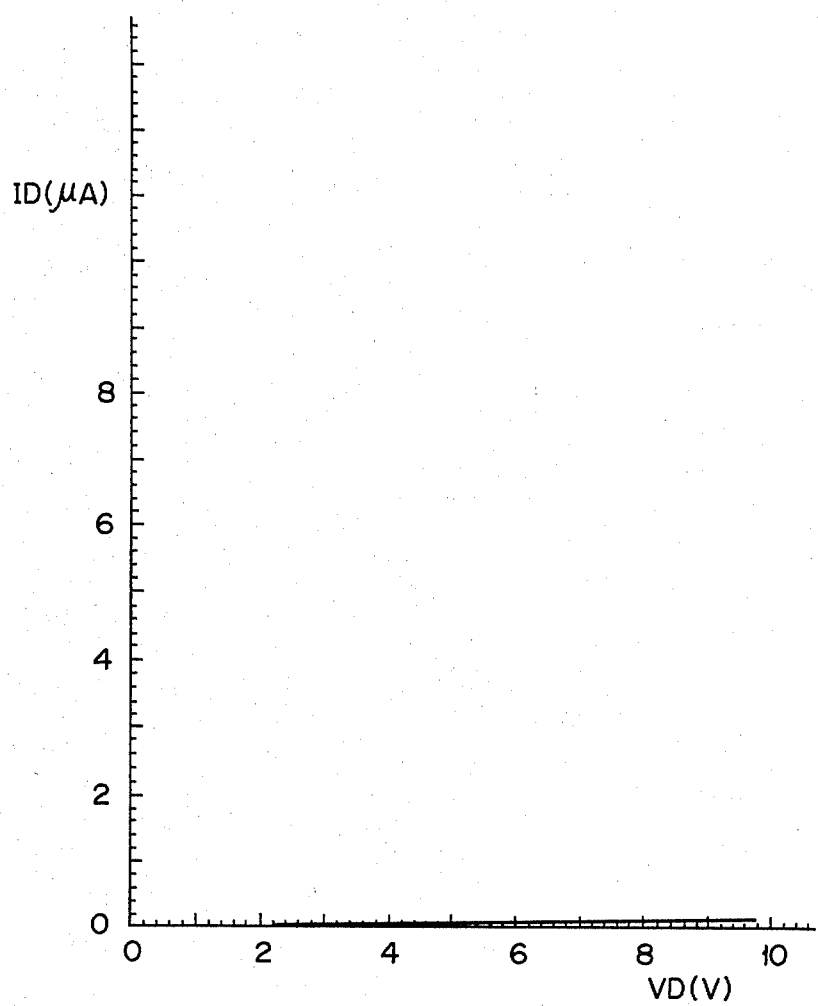
Figure 20:
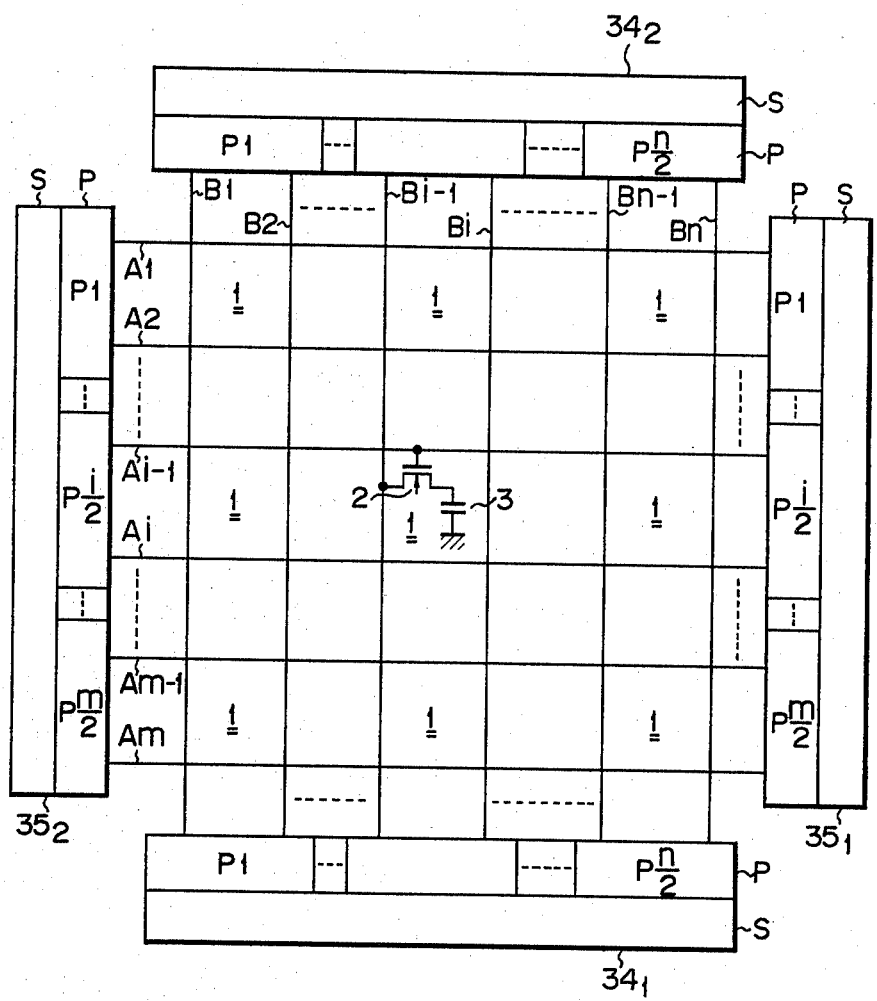
Figure 21:
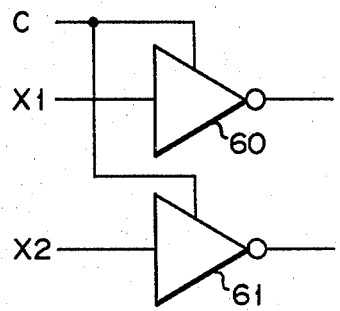
Figure 22:
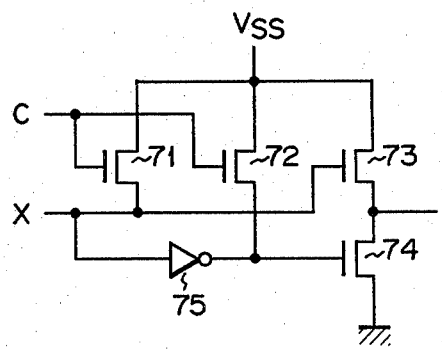

FIGS. 17, 18, and 19 are graphs showing the characteristics of the memory cell transistor, each explaining the present invention;

FIG. 20 is a view illustrating the circuit configuration according to another embodiment of the present invention;

FIG. 21 is a circuit diagram illustrating part of the inside the driver circuit shown in FIG. 20; and FIG. 22 is a view illustrating an actual example of FIG. 21.

FIG. 2 shows one embodiment of the memory device of the present invention. The memory device shown in FIG. 2 comprises pairs of data buses B and b to which same video signals are supplied. The memory device further has pairs of address buses A and a to which same scanning signals are supplied. Bridge lines 4 are formed between the pairs of data buses for short-circuiting the data bus B and the data bus b, and bridge lines 5 are formed between the pairs of address buses for short-circuiting the address bus A and the address bus a. The lines 4 form closed loops 1B for the paired data buses B and b, and the lines 5 form closed loops 1A for the paired address buses A and a. The sizes of these loops 1B and 1A, i.e., the distance between the lines 4 or the distance between the lines 5 may be determined arbitrarily. Test pads 6 are formed at the contact points between the data buses B and b and the bridge line 4. Test pads 7 are formed at the contact points between the address buses A and a and the bridge line 5. Fuses 8 which may be melted away are formed between the pad 6 and the data bus B and between the pad 6 and the data bus b. Fuses 9 which may be melted away are formed between the pad 7 and the address bus A and between the pad 7 and the address bus a.

Memory cells 10 are formed between the data buses B and b, and the address buses A and a. The memory cells 10 are constructed in the manner described below. In a cell 10a (at the upper left corner of FIG. 2), the gates of n-channel type first and third MOS transistors 11 and 13 are connected to an address bus A1 and the gates of n-channel type second and fourth MOS transistors 12 and 14 are connected to an address bus a1. The drains (or the sources) of the transistors 11 and 14 are connected to a data bus B1 and the drains (or the sources) of the transistors 12 and 13 are connected to a data bus b1. The sources (or the drains) of the transistors 11 to 14 are connected to a common portion 15 (capacitor electrode). A capacitor 16 is formed between the portion 15 and the circuit ground (the substrate). The transistors 11 to 14 and the capacitor 16 form one memory cell 10. The transistors 11 to 14 may be p-channel type transistors.

FIG. 3 shows a device which embodies the circuit shown in FIG. 2.

FIG. 3 shows part of the circuit shown in FIG. 2 and is a partial top view of an IC pattern. Referring to FIG. 3, the data buses b1, B2, b2, B3, b3, and B4 formed as diffusion layers and the address buses a1, A2, a2, and A3 formed as aluminum patterns are arranged in a matrix form. The bridge lines 5 are formed by diffusion between the address buses A2 and a2. The test pads 7 are formed at contact points 17 between the bridge line 5 and the address buses A2 and a2. The address buses A2 and a2 are paired so that either of the buses A2 or a2 is capable of driving the memory cell 10. The fuses 9 which may be melted away by a laser beam or the like are formed by narrowing the aluminum wiring between the test pad 7 and the address bus A2 and between the test pad 7 and the address bus a2. One of the memory cells 10 is surrounded in the contact points between the address buses A2 and a2 and the data buses B3 and b3. Most of the area of the memory cell 10 is occupied by the capacitor 16. First through fourth MOS transistors 11, 12, 13 and 14 connected to the upper electrode of the capacitor 16 as the common portion 15 are formed at the four respective corners of the capacitor 16. The gate electrodes of the first and third transistors 11 and 13 are formed by extending the address bus A2 toward the common electrode 15 side. The first diffusion electrodes (drains) of the first and third transistors 11 and 13 are formed by extending the data buses B3 and b3 toward the gate electrode side. The second diffusion electrodes (sources) of the transistors 11 and 13 are diffusion layers which are independent from the data buses B3 and b3 but may be formed simultaneously with the formation of the first diffusion electrodes and the data buses B and b. The gate electrodes of the second and fourth transistors 12 and 14 are formed by extending the address bus a2 toward the common electrode 15 side and the first electrodes (drains) of these transistors are formed by directly extending the data buses B3 and b3 formed by diffusion toward the gate electrode side. The second electrodes (sources) of the transistors 12 and 14 are formed by diffusion independently of the data buses B3 and b3 as in the case of the transistors 11 and 13.

With the memory device shown in FIGS. 2 and 3, even when short-circuiting or a disconnection is caused in any data bus B, b or in any address bus A, a due to defects in a mask or contamination introduced during the manufacturing process, the defective parts may be eliminated in the manner to be described below.

A case is now considered wherein a disconnection is caused at a point α on the address line A1 shown in FIG. 2. In this case, the address signals on the address bus A1 are no longer supplied to the first and third transistors 11 and 13 at the cells 10a, so that the transistors 11 and 13 are rendered inoperative. However, with the memory device shown in FIG. 2, due to the presence of the other address line a1 and the bridge lines 5, the signal paths 1c and 1d function as pilot bus lines. Thus, the cell 10a, which cannot be operated by the transistors 11 and 13 due to the disconnection at the point α, may be operated by the second and fourth transistors 12 and 14. With this memory device, the cells 10 do not become defective as long as a bus line is effectively formed by the address buses A and a and the bridge lines 5.

On the other hand, in FIG. 2, there are cases wherein short-circuiting is caused at the point α on the address line A1 with an adjacent circuit pattern (not shown). However, when such a problem occurs, fuses 9a and 9b may be cut by a laser beam to separate the defective short-circuited part from the bus line A1. The short-circuiting may be eliminated by such cutting since the bus lines 1c and 1d are alive. Therefore, defects due to short-circuiting may also be eliminated with the memory device shown in FIGS. 2 and 3.

Since the elimination of defects due to disconnection or short-circuiting for the data buses B and b may be performed in the manner described above, the description thereof is omitted.

Figure 4:
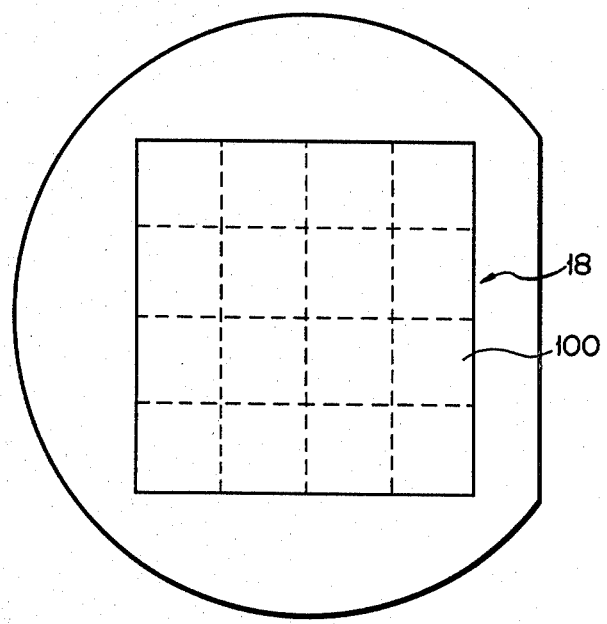
FIG. 4 is a view illustrating the case when the device of the present invention is formed on a semiconductor wafer.
Figure 5:
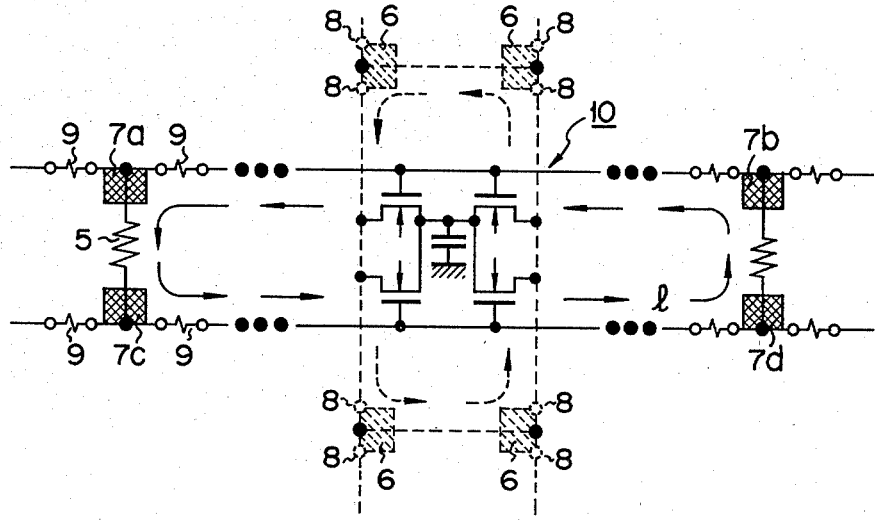
FIG. 5 is a partial circuit diagram for explaining the present invention.

With such devices, the problem is how to find the defective point α. However, this may be easily accomplished by using a conventional test machine. For performing the test in an easy manner, the bridge lines 4 and 5, the test pads 6 and 7, and the fuses 8 and 9 are arranged for a memory device 18 formed on one wafer as shown in FIG. 4. For example, the 256×256 memory cell array 100 may be divided into four parts longitudinally and again into four parts transversely, as shown in FIG. 4. The respective memory block of the array 100 divided into 16 blocks comprises a 64×64 memory cell array. The bridge lines, the test pads and the fuses are arranged at the peripheries of the respective memory blocks. Then, a closed loop 1 as shown in FIG. 5 is formed in each memory block. In FIG. 5, four test rods (not shown) are brought into contact with the pads 7a, 7b, 7c and 7d. Conduction tests are performed at the test points shown below:

between the pads 7a–7b;
between the pads 7b–7d;
between the pads 7d–7c;
between the pads 7c–7a; and
between the pads 7a, 7b, 7c and 7d, and the substrate (not shown).

Such conduction tests are performed with all of the 16 memory blocks. Then, the defective parts such as disconnected or short-circuited parts may be easily detected. (Since four pads are included in each memory cell and they are 64 to a column and 64 to a row, the test pads number (64+64)×4=512.)

Since the testing method described above is similarly applicable to the data buses, the description thereof will be omitted. In the memory device shown in FIG. 3, the data buses which include fuses are formed by diffusion layers. However, with this device, the diffusion layers are cut at the fuses 9 and the data buses are connected by the fuses 9.

Since it is possible to eliminate the defective parts found by the tests with the construction shown in FIGS. 2, 3, 4, and 5, a memory device with vastly improved yield may be produced.

Figure 6:
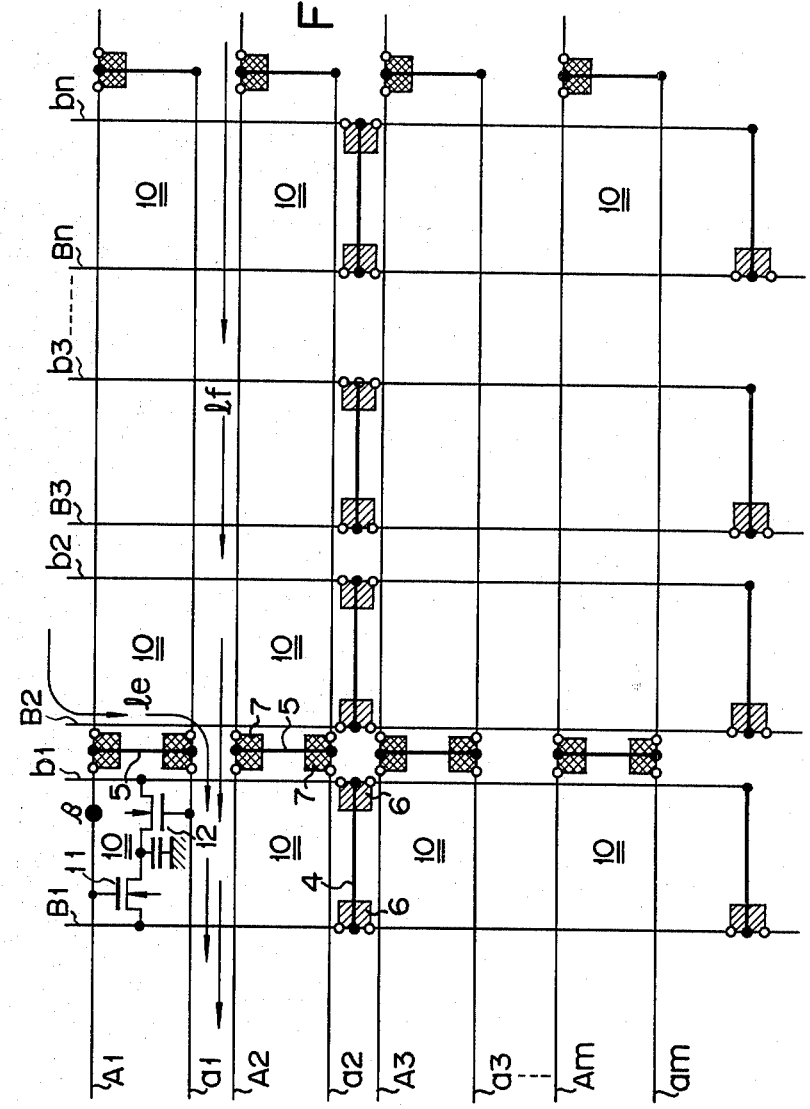
FIGS. 6 to 8 are circuit diagrams for explaining modifications of the present invention.

FIG. 6 shows the second embodiment of the present invention. FIG. 6 shows the device of FIG. 2 with the third and fourth transistors 13 and 14 removed from the memory cells 10. With such a construction, it is still possible to avoid disconnection and short-circuiting at a point β on the address bus A1 by forming a loop 1e and a path 1f.

Figure 7:
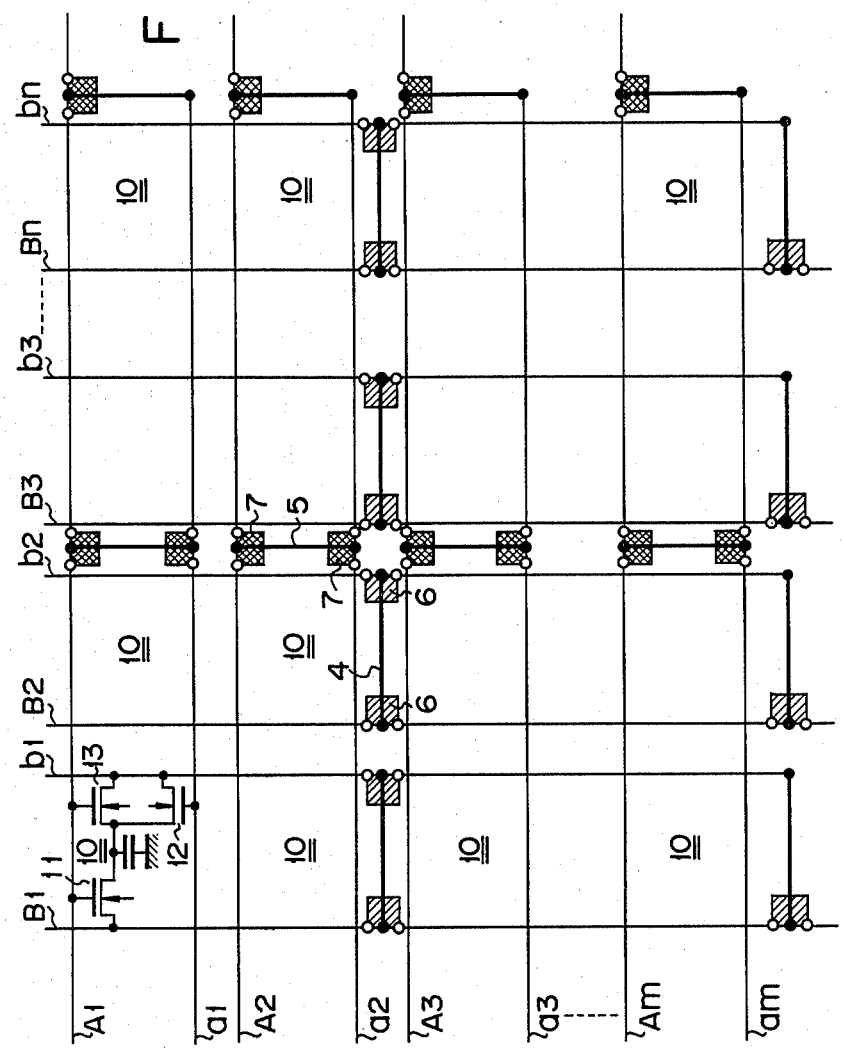

FIG. 7 shows the third embodiment of the present invention. FIG. 7 shows the device of FIG. 2 with the fourth transistor 14 removed from the memory cells 10. It is also possible with this method to obtain similar effects by forming a closed loop formed network as in the case of FIG. 6.

However, with the first, second and third embodiments, the devices with more transistors constituting the cells 10 have less tendency to provide a defective memory device, as may be apparent from the examples shown in Tables 1A and 1B.

TABLE 1A

| Case No. | Address bus A1 | Address bus a1 | Data bus B1 | Data bus b1 | Prior art (FIG. 1A) One transistor | Present invention Two transistor | Present invention Three transistor | Present invention Four transistor |
|---|---|---|---|---|---|---|---|---|
| 1 | 0 | 0 | 0 | 0 | GO | GO | GO | GO |
| 2 | 0 | 0 | 0 | 1 | GO | GO | GO | GO |
| 3 | 0 | 0 | 1 | 0 | NG | GO | GO | GO |
| 4 | 0 | 0 | 1 | 1 | NG | NG | NG | NG |
| 5 | 0 | 1 | 0 | 0 | GO | GO | GO | GO |
| 6 | 0 | 1 | 0 | 1 | GO | GO | GO | GO |
| 7 | 0 | 1 | 1 | 0 | NG | NG | GO | GO |
| 8 | 0 | 1 | 1 | 1 | NG | NG | NG | NG |
| 9 | 1 | 0 | 0 | 0 | NG | GO | GO | GO |
| 10 | 1 | 0 | 0 | 1 | NG | NG | NG | GO |

TABLE 1B

| Case No. | Address bus A1 | Address bus a1 | Data bus B1 | Data bus b1 | Prior art (FIG. 1A) One transistor | Present invention Two transistor | Present invention Three transistor | Present invention Four transistor |
|---|---|---|---|---|---|---|---|---|
| 11 | 1 | 0 | 1 | 0 | NG | GO | GO | GO |
| 12 | 1 | 0 | 1 | 1 | NG | NG | NG | NG |
| 13 | 1 | 1 | 0 | 0 | NG | NG | NG | NG |
| 14 | 1 | 1 | 0 | 1 | NG | NG | NG | NG |
| 15 | 1 | 1 | 1 | 0 | NG | NG | NG | NG |
| 16 | 1 | 1 | 1 | 1 | NG | NG | NG | NG |
| Ratio | | | | | 4/16 | 7/16 | 8/16 | 9/16 |

Note:
GO: Case wherein the memory cells are operating normally.
NG: Case wherein the memory cells are inoperative.
0: The buses are normal.
1: The buses are defective due to disconnection and/or short-circuiting.

In Tables 1A and 1B, according to the one transistor construction, the transistor 11 is connected only to the address bus A1 and the data bus B1. According to the two transistor construction, the transistor 11 is connected to the address bus A1 and the data bus B1 and the transistor 12 to the address bus a1 and the data bus b1. According to the three transistor contruction, the transistors 11, 12, and 13 are connected to the address bus A1 and the data bus B1, to the address bus a1 and the data bus b1 and to the address bus A1 and the data bus b1. According to the four transistor construction, the transistors 11 to 14 are connected to the address bus A1 and the data bus B1, to the address bus a1 and the data bus b1, to the address bus A1 and the data bus b1, and to the address bus a1 and the data bus B1, respectively. In Tables 1A and 1B, the rate of producing normal memory cells for each construction is considered in $2^4 = 16$ ways. In these 16 possible cases, the four cases (case No 3, 7, 9 and 11 in Tables 1A and 1B) provide non-defective device.

As may be apparent from Tables 1A and 1B, with the device having the construction according to the present invention, it is easily understood that the "memory non-defective rate" or the "yield" changes according to the cell construction.

In the above tables, the values such as 4/16 and 7/16 indicate the number of nondefective cells based on the cells 1 to 16 which may be defective. Therefore, the yield improvement of the memory device itself is more significant.

The yield of the production of the circuit shown in FIG. 2 as compared with the circuit configuration shown in FIG. 1 may be made clear by the calculations to be represented below.

Figure 1A:
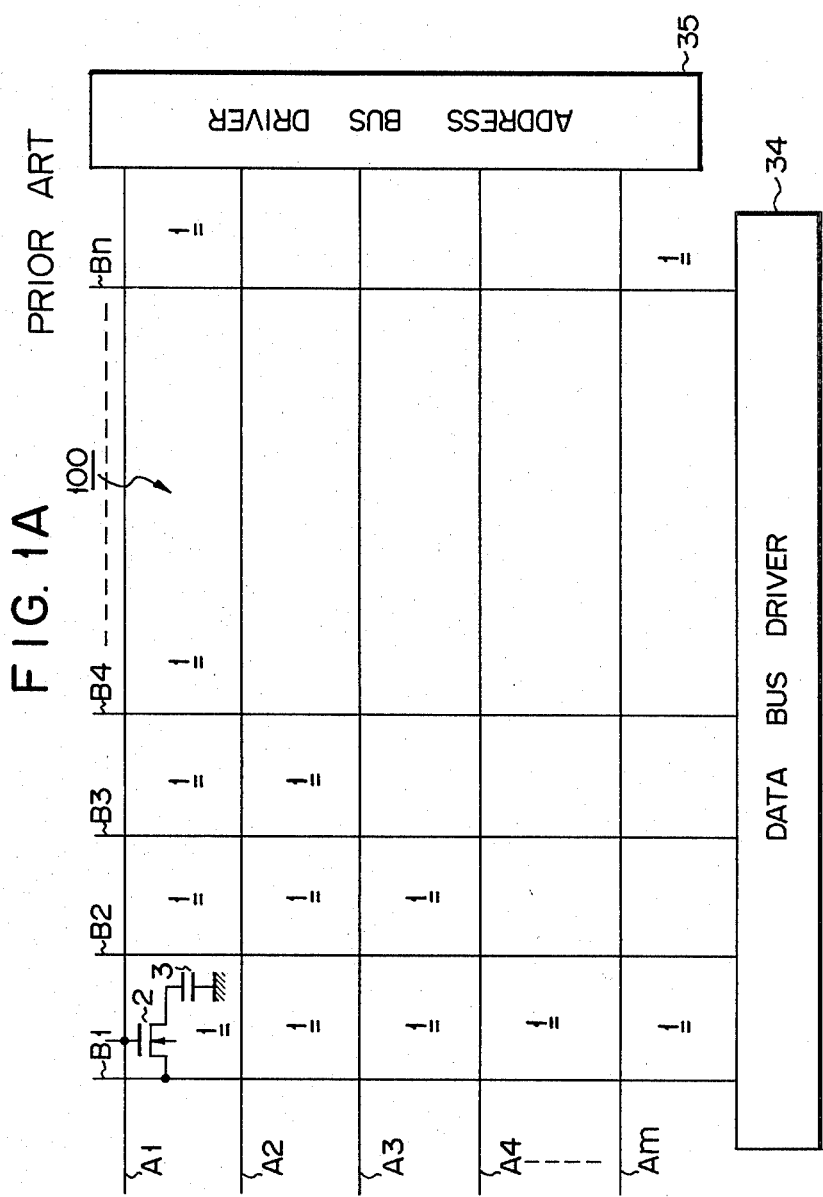
FIG. 1A is a circuit diagram of a conventional memory device.
Figure 1B:
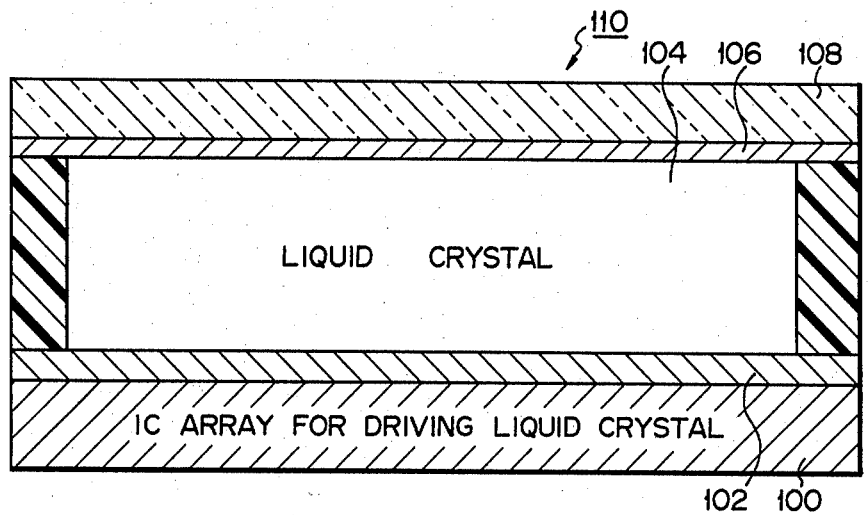
FIG. 1B is a sectional view of an LCD panel using the memory device.
Figure 9A:
FIGS. 9A and 9B are views for explaining the calculations of the yields.

The conditions used in the description of FIG. 1 are applied to FIG. 2 so that the number of memory cells is 256×256, the memory cells are arranged at a 300 micron pitch, and the widths of the address buses and the data buses are 5 microns. The respective yields may then be obtained as follows:

First, from the general formula applicable to the present invention, the yield y' when the scale is reduced to 1/n may be represented by the equation:

$$y' = y^{1/n} \tag{9}$$

where the yield for the unit bus as shown in FIG. 9A is y. The yield y'' when 1/n scale is considered for one memory block using the paired buses, i.e., the yield for dual, one-block, and 1/n scale unit may be represented by the equation:

$$y'' = 1 - (1 - y^{1/n})^2 \tag{10}$$

Figure 9B:
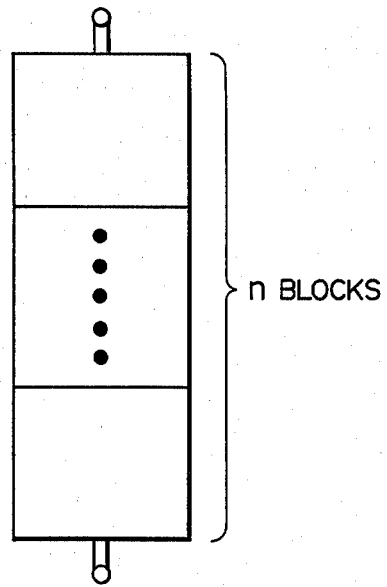

The yield y* for a dual, n-block and 1 scale unit as shown in FIG. 9B may be represented by the following equation:

$$y^* = \{1 - (1 - y^{1/n})^2\}^n \tag{11}$$

Since another factor for defectiveness (e.g. short-circuiting of the A1-A1 lines) is introduced due to the adoption of dual bus system, the yield for one bus is reduced from 0.9924 to 0.9835. This data is applied to equation (11), n being 4. With the memory device as shown in FIG. 2, the yield $y_{ON}$ with the method of FIG. 9B may be obtained as follows:

$$y_{ON} = \{1 - (1 - 0.9835^{\frac{1}{4}})^2\}^4 = 0.999931 \tag{12}$$

The yield $Y_{ON}$ for all of the 256 non-defective address buses together is obtained as follows:

$$Y_{ON} = [y_{ON}]^{256} = 0.9825 \tag{13}$$

When similar calculations are performed with the data buses, the yield for one bus becomes 0.991 to 0.9607. Therefore, $$y_N = \{1 - (1 - 0.9607^{\frac{1}{4}})^2\}^4 = 0.99960 \tag{14}$$

The yield for all of the 256 non-defective data buses together may be obtained as follows:

$$Y_N = [y_N]^{256} = 0.9031 \tag{15}$$

The yield $Y_N^T$ for all the bus wirings may be obtained as follows:

$$Y_N^T = 0.9825 \times 0.9031 = 0.888 \ (88.8\%) \tag{16}$$

Thus, the yield becomes 88.8% according to the present invention, as compared with the conventional yield, 1.4%; the difference between these two is apparent.

A memory device with various advantages may thus be provided.

Figure 8:
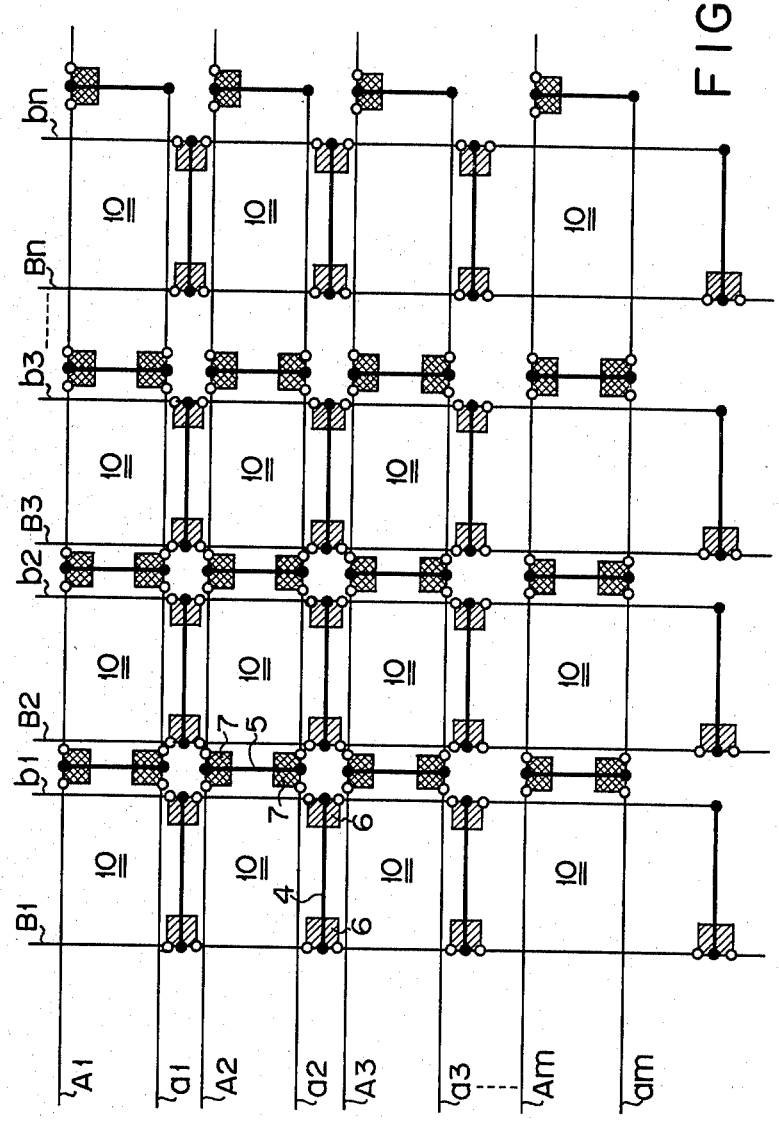

The present invention is not limited to the particular embodiments described, but many modifications may be made without departing from the scope of the appended claims. For example, although the bridge lines and pads are of block type in the memory device shown in FIGS. 2, 6 and 7, they may be disposed for each cell as shown in FIG. 8 if the complexity involved in testing and the times of fusing the fuses are neglected. The fuses may be made of polysilicon and so on. The pads, the fuses, and the bridge lines may be formed on either the address buses or the data buses.

The bus driver circuit may be built-in or may be disposed externally.

Figure 10:
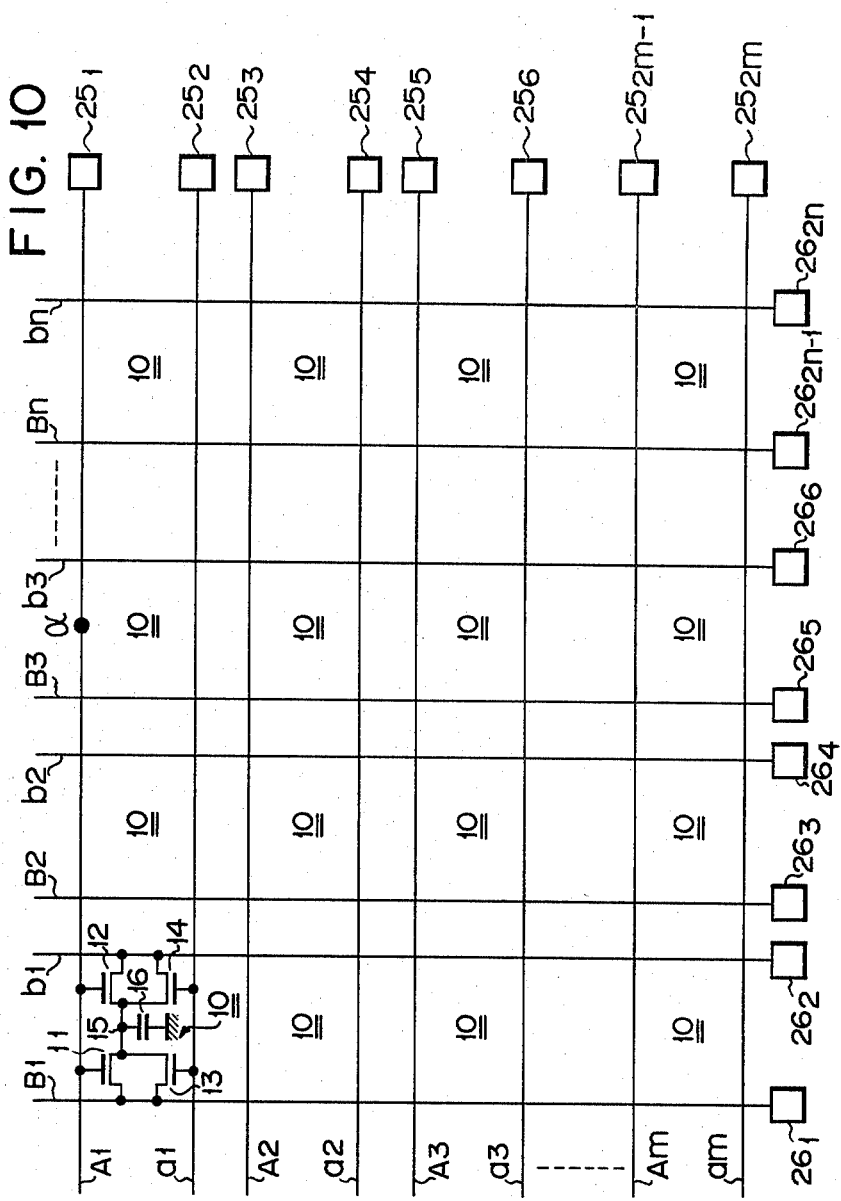

FIG. 10 shows another embodiment of the memory device of the present invention. According to the memory device of FIG. 10, pairs of address buses A and a, which are supplied with the same scanning signals, and pairs of data buses B and b, which are supplied with the same video signals, are arranged in a matrix form. Memory cells 10 are formed at respective regions surrounded by the paired address buses A and a and the paired data buses B and b. The respective memory cells 10 comprise four MOS transistors 11, 12, 13, 14, and the capacitor 16 formed between the source electrode common portion 15 of these MOS transistors 11, 12, 13 and 14 and the circuit ground (substrate). The gate electrodes of the MOS transistors 11 and 12 are connected to the address bus A which is one of the paired address buses A and a, and the gate electrodes of the MOS transistors 13 and 14 are connected to the address bus a which is the other of the pair. The respective drain (or source) electrodes of the MOS transistors 11 and 13 are connected to the data bus B which is one of the paired data buses B and b, and the respective drain electrodes of the MOS transistors 12 and 14 are connected to the other data bus b. With the respective address buses A and a, bonding pads $25_1$ to $25_{2m}$ are arranged in a line at the bus ends at the right side of FIG. 10, and bonding pads $26_1$ to $26_{2n}$ are arranged in a line at the bus ends at the bottom of FIG. 10.

With the memory device shown in FIG. 10, when short-circuiting or a disconnection is caused in any of the address buses A and a or any of the data buses B and b due to defects in a mask or contamination introduced during the manufacturing process, such defective parts may be eliminated in the manner to be described below.

For example, when short-circuiting or a disconnection is caused at a point α on the address bus A1 as shown in FIG. 10, the scanning signals are no longer supplied to the MOS transistors 11 and 12 of the transverse row of memory cells 10 to which the signals of the address bus A1 are to be supplied, so that these transistors are rendered inoperative. However, with this device, due to the presence of the other address bus a1 of the pair, the respective memory cells 10 which are not operated by the address bus A1 are rendered operative by the other MOS transistors 13 and 14. Thus, if the bonding pad $25_2$ formed at the end of the bus line a1 where the short-circuiting or the disconnection is not present is connected by the bonding wire to the output pad of the corresponding address bus driver circuit (not shown), the scanning signals outputted from the address driver circuit are supplied to the gate electrodes of the MOS transistors 13 and 14 of the respective memory cells 10 through the address bus a1 where the short-circuiting or the disconnection is not present. Thus, the memory cells 10 do not become defective even when a short circuit or a disconnection is present in one of the paired address buses.

Since the above procedure for short circuits and/or disconnections with the data buses B and b may be described in a similar manner, the description thereof will be omitted.

By the way, the problem with such a device is how to detect such a defective point α. However, this may be easily detected with a conventional device, using the bonding pads 25 and 26 as test pads.

With the device shown in FIG. 10, the memory cells which become defective with conventional single type bus lines may be turned into non-defective units so that the manufacturing yield may be improved. The increase in the occupying area of the IC pellet due to pairing of bus lines is only about 14%.

Figure 11:
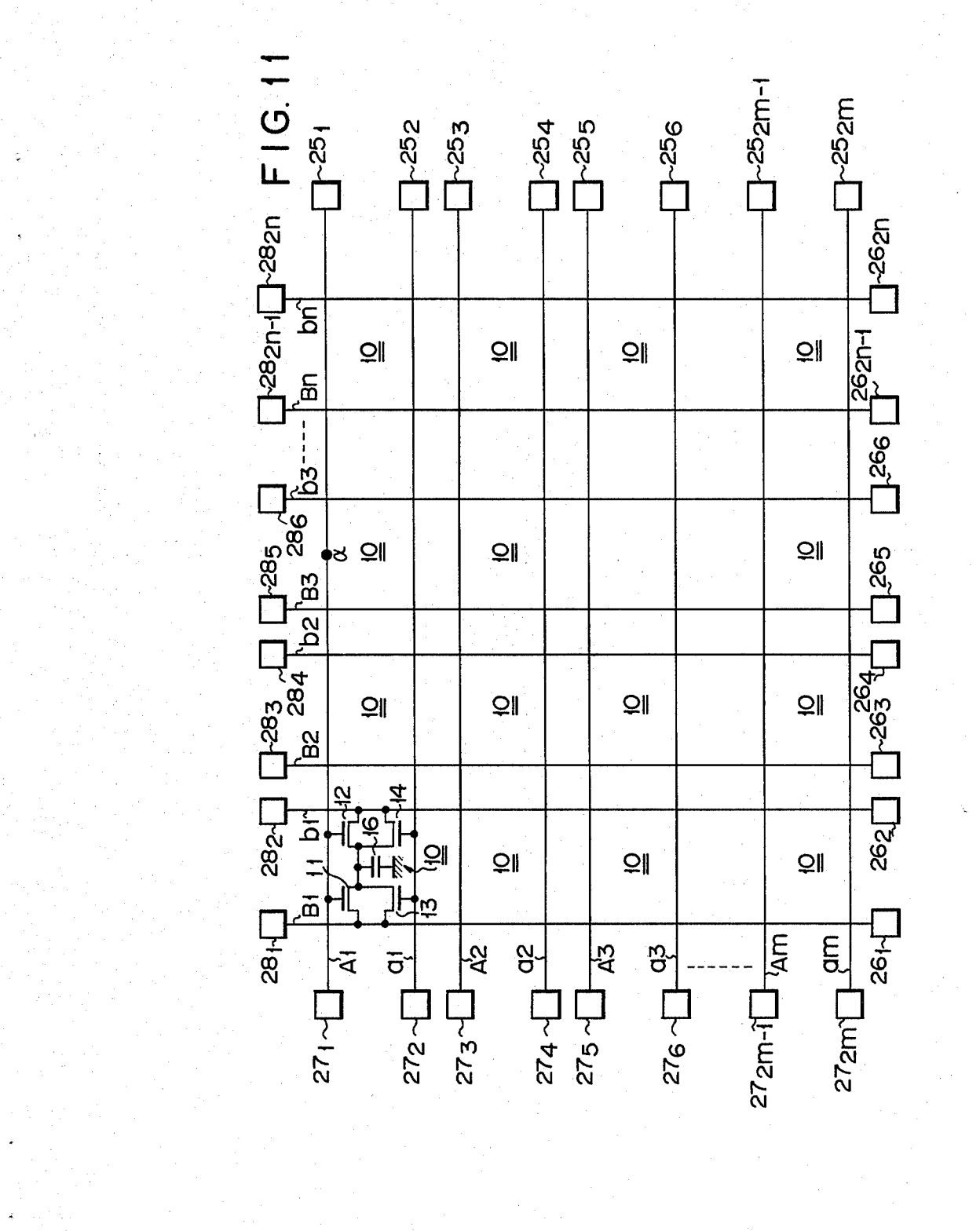

FIG. 11 shows another embodiment of the present invention. With the device shown in FIG. 11, bonding pads 25 and 27 are arranged in a line at both ends of the respective address buses A and a and the bonding pads 26 and 28 are arranged in a line at both ends of the respective data buses B and b. With such a construction, a case when a disconnection occurs at the point α on the address bus A1 is considered. In this case, the bonding pads $25_1$ and $27_1$ formed at both ends of the address bus A1 are connected in parallel with the bonding pads $25_2$ and $27_2$ of the address bus a1 and also connected to the output pads of the corresponding address bus driver circuit (not shown) of the buses A1 and a1. The transverse row of memory cells 10 to which the signals of both address buses A1 and a1 are to be supplied may thus be made non-defective.

The yield obtained with the device of the present invention will be calculated. The conditions are the same as considered above, the number of memory cells is 256×256, they are arranged at a 300 micron pitch, the address buses A and a are aluminum wirings of 5 micron width, and the data buses B and b are n+-type diffusion wirings of 5 micron width.

The yield $y_o$ for one address bus is 0.9924 as in the conventional case, and the yield $Y_{AN}$ for either of the pair being non-defective may be calculated as follows:

$$Y_{AN}=1-(1-0.9924)^2\approx 0.99994 \qquad (17)$$

The yield $Y_{AN}$ for all of the 256 pairs of address buses being non-defective may be calculated as follows:

$$Y_{AN}=[y_{AN}]^{256}\approx 0.985 \qquad (18)$$

When similar calculations are performed with the data buses, $$Y_{DN}=1-(1-0.991)^2\approx 0.99992 \qquad (19)$$

The yield for all of the 256 pairs of data buses being non-defective may be calculated as follows:

$$Y_{DN}=[y_{DN}]^{256}\approx 0.979 \qquad (20)$$

The yield $Y_N^T$ for all of the bus wirings may be calculated as follows:

$$Y_N^T=0.985\times 0.979\approx 0.964 \qquad (21)$$

Thus, the yield reaches as high as 96.4% according to the present invention as compared with 1.4% for conventional cases, and the difference between these two is obvious. The effective manufacturing cost may be reduced when the yield is improved.

The present invention is not limited to the above particular embodiment. For example, although the bonding pads 25, 26, 27 and 28 were arranged in a line for each case in the above description, they may alternatively be arranged to alternate in two stepped rows. Although four MOS transistors 11, 12, 13 and 14 were formed in the respective memory cells, they are not limited to four, but must number more than two. However, as has been described above with reference to Tables 1A and 1B, the memories are less frequently defective when more MOS transistors are used.

Figure 12:
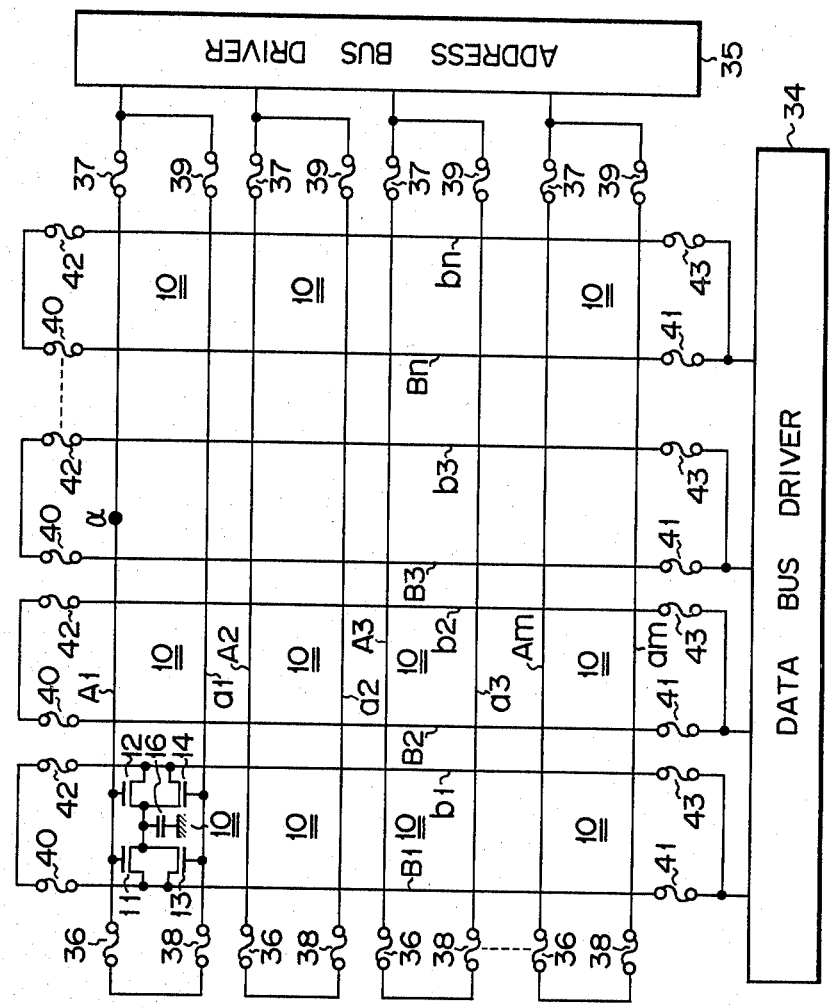
FIG. 12 is a view illustrating the circuit configuration of the memory device for improving the manufacturing yield according to another embodiment of the present invention.

A memory device as shown in FIG. 12 has also been proposed for preventing the reduction in the yield due to defects in a mask or contamination introduced during the manufacturing process. In this device, two address buses and two data buses are paired for one memory cell. Four fuses 36, 37, 38 and 39 which may be cut away by a laser beam or the like are formed at both ends of the paired address buses A and a by, for example, narrowing the aluminum wiring. The fuses 36 and 38 located at the left end of the figure are connected to each other by one end, and the fuses 37 and 39 at the right end of the figure are connected to each other by one end to form closed loops of paired address buses A and a in a number corresponding to the number of address bus circuits. Four fuses 40, 41, 42 and 43 are formed for the paired data buses B and b, and closed loops are formed in a number corresponding to the number of data bus circuits. The scanning signals outputted from address bus driver circuit 35 are supplied time sequentially to the respective closed loops formed by the address buses A and a, and the video signals outputted from data bus driver circuit 34 are supplied to the respective closed loops formed by the data buses B and b. The memory cells 10 are formed at respective crossing points of the address buses A and a and the data buses B and b arranged in a matrix form. Each of the memory cells 10 has four MOS transistors 11, 12, 13 and 14. The gate electrodes of the two transistors 11 and 12 are connected to one of the paired address buses, the bus A, and the gate electrodes of the remaining two transistors 13 and 14 are connected to the other bus a. The drain electrodes of the two transistors 11 and 13 are connected to one of the paired data buses, the bus B, and the drain electrodes of the remaining two transistors 12 and 14 are connected to the other bus b. The source electrodes of the four transistors 11, 12, 13 and 14 are commonly connected, and the charge storing capacitor 16 is disposed between the source electrode common portion and the circuit ground (substrate).

With the memory device shown in FIG. 12, even when a short circuit and/or a disconnection is caused in any of the address buses A, a and any of the data buses B, b due to defects in a mask or contamination introduced during the manufacturing process, the defective parts are eliminated in the manner to be described below.

The disconnections in the respective address buses A and a and the respective data buses B and b and short circuits with other wirings and with the substrate are detected. The paired fuses 36 and 37 or 38 and 39, or the paired fuses 40 and 41 or 42 and 43 formed at both ends of the bus which has at least one such defect are cut, and the defects are thus eliminated.

The yield obtainable with the device described above will be calculated. The conditions are the same as in the case of FIG. 1A. The number of memory cells is $256 \times 256$ and they are arranged at a 300 micron pitch. The address buses A and a are aluminum wirings of 5 micron width, and the data buses B and b are $n^+$-type diffusion wirings of 5 micron width.

The yield $y_O$ for one address bus is 0.9924 as in the case of FIG. 1A. The yield $y_{AN}$ when either is non-defective when the address buses are paired may be calculated as follows:

$$y_{AN} = 1 - (1 - 0.9924)^2 \approx 0.99994 \quad (22)$$

The yield $Y_{AN}$ for either of the pair being non-defective for all the 256 pairs of address buses may be calculated as follows:

$$Y_{AN} = [y_{AN}]^{256} \approx 0.985 \quad (23)$$

When similar calculations are performed with the data buses, $$y_{DN} = 1 - (1 - 0.991)^2 \approx 0.99992 \quad (24)$$

The yield $Y_{DN}$ for either of the pair to be non-defective for 256 pairs may be calculated as follows:
$$Y_{DN} = [y_{DN}]^{256} \approx 0.979 \quad (25)$$

Thus, the yield $Y_N^T$ for all the bus wirings may be calculated as follows:

$$Y_N^T = 0.985 \times 0.979 \approx 0.964 \quad (26)$$

The yield of the memory device shown in FIG. 12 reaches as high as 96.4% as compared with the 1.4% obtained with the conventional device shown in FIG. 1A, and the difference between them is very large.

However, with the device shown in FIG. 12, when a disorder is caused at a point $\alpha$ on the address bus A1 and the fuses 36 and 37 are cut, the following problems may be caused. The scanning signal is no longer supplied to the transistors 11 and 12 in the respective memory cell of the transverse row to which the signal of the address bus A1 is to be supplied, so that these transistors are rendered inoperative. Then, the gate electrodes of the transistors 11 and 12 float. When the gate electrodes float, unstable channel leakage current flows along the drain-source paths of the transistors 11 and 12. As a result, the charging voltage of the capacitors 16 inside the memory cells 10 including the transistors 11 and 12 which have been rendered inoperative by the short circuit/disconnection varies in an unstable manner, so that picture degradation such as partial flickering tends to occur.

Figure 13:
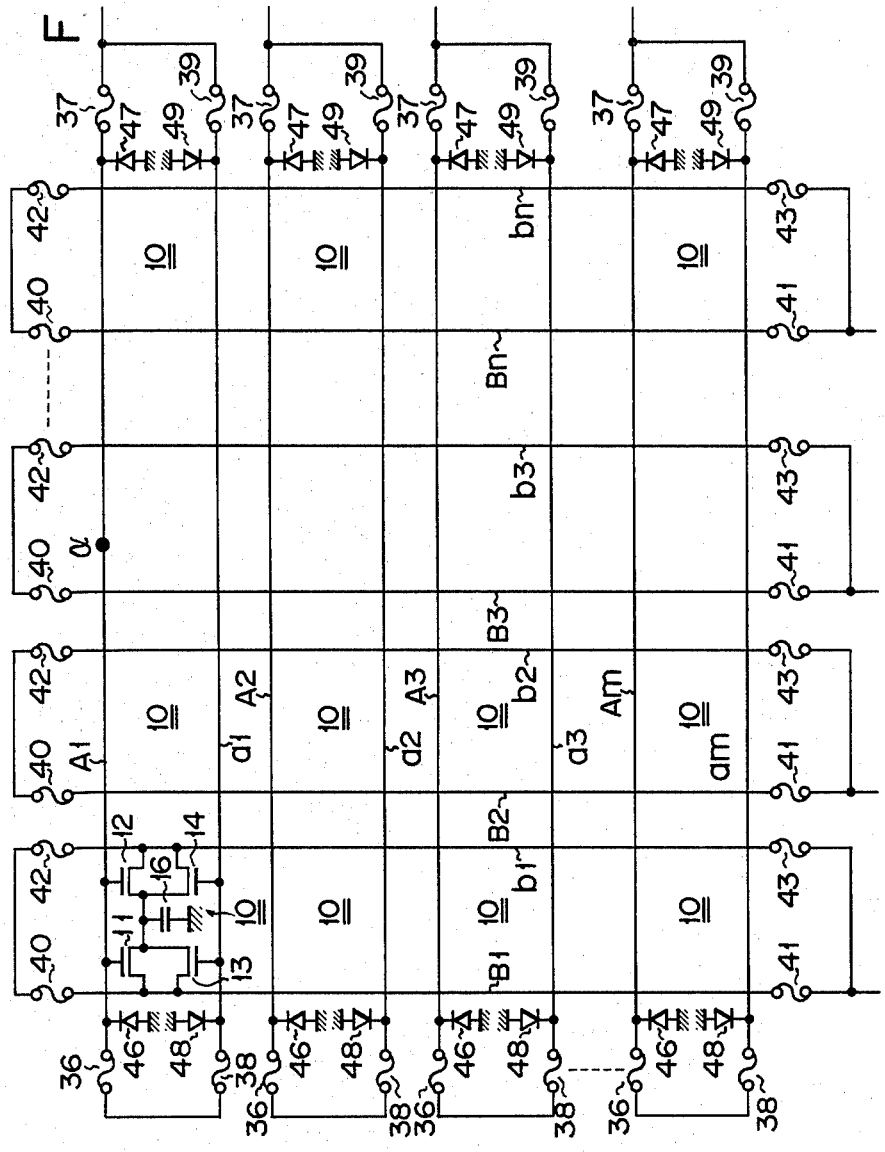
FIG. 13 is a view illustrating the circuit configuration of still another embodiment of the present invention.

FIG. 13 shows another embodiment of the present invention which eliminates these problems described above. The same reference numerals denote the same parts as in FIG. 12. With the memory device shown in FIG. 13, diodes 46, 47, 48 and 49 are connected between the non short-circuited buses and the circuit ground around the four fuses 36, 37, 38 and 39 formed at both ends of the paired address buses A and a. The diodes 46, 47, 48 and 49 are so connected that they are reversely biased by the scanning signals outputted by the address bus driver circuit (not shown). For example, the anodes of the diodes are at the circuit ground potential when the scanning signals are positive only.

With such a construction, a case is considered in which a disorder is caused at the point $\alpha$ on the address bus A1 and the fuses 36 and 37 are cut. In this case, the gate electrodes of the transistors 11 and 12 connected to the address bus A1 are clamped at substantially the ground voltage potential through the diode 46 (or 47). Then, the gate electrodes of the transistors 11 and 12 do not float unlike in the case of the memory device shown in FIG. 12, and picture degradation such as partial flickering of the reproduced picture is not caused.

The address bus a1 at the side where the disorder has not been caused and by which the scanning signals are supplied to the respective memory cells 10 is connected to the ground potential through one pair of diodes 48 and 49. Since the diodes 48 and 49 are reversely biased with respect to the scanning signal, they function as high impedance elements. Thus, the diodes 46 to 49 do not provide adverse affects to the operation of the memory device.

Figure 14:
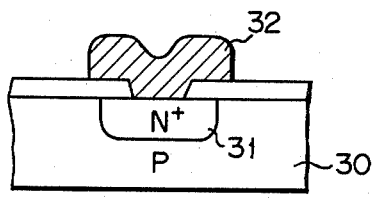
FIG. 14 is a sectional view illustrating the p-n diode structure at part of the circuit of the embodiment shown in FIG. 13.

FIG. 14 is a sectional view illustrating a particular embodiment for forming the diodes 46, 47, 48 and 49 in an IC. The respective diodes 46, 47, 48 and 49 comprise a p-type substrate 30, and an n+-type semiconductor region 31 formed by diffusion on the surface of the substrate 30. Numeral 32 denotes an aluminum wiring constituting the address buse A or a.

Figure 15:
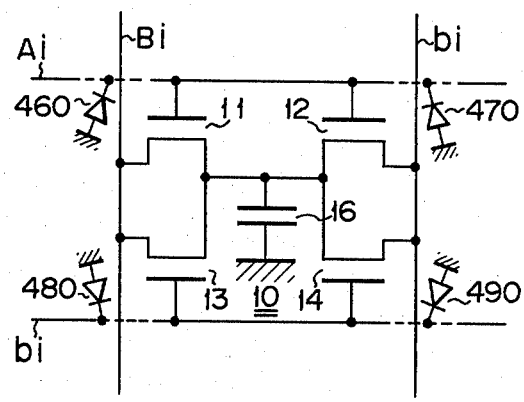
FIG. 15 is a view illustrating part of the circuit configuration according to still another embodiment of the present invention.
Figure 16:
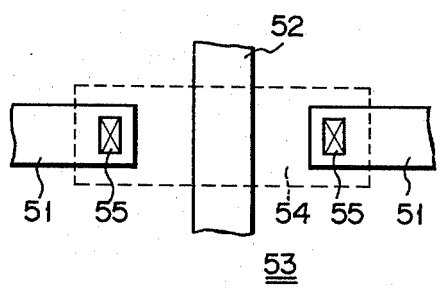
FIG. 16 is a plan view illustrating part of the circuit according to the embodiment shown in FIG. 15.

FIG. 15 is a view illustrating the circuit configuration of still another embodiment of the present invention and shows only one memory cell. In the description of the circuit of the embodiment shown in FIG. 13, a case was described in which two diodes are formed for each of the paired address buses A and a. However, it is also possible to form the address buses A and a and the data buses B and b by the aluminum wirings, and to form the diodes by forming the address buses A and a at parts crossing the data buses B and b by n+-type diffusion layers, which are of the opposite conductivity type to that of the substrate. The n+-type diffusion layers are used for connecting the circuits, and the diodes are formed between the n+-type layers and the p-type substrate. Such a construction is known as a crossunder construction. With this construction, four diodes 460, 470, 480 and 490 are formed at each of the four corners of the respective memory cells 10 as shown in FIG. 15. FIG. 16 is a plan view illustrating the above-mentioned crossunder part wherein numeral 51 denotes an address bus of aluminum wiring; 52, a data bus of aluminum wiring; 53, a p-type substrate; 54, an n+-type diffusion region; and 55, a contact hole connecting the address bus 51 with the diffusion region 54.

FIG. 17 is a voltage (VD) - current (ID) characteristic of the MOS transistor 11, 12, 13 or 14 formed in the respective memory cells of FIGS. 13 and 15. FIG. 17 shows the characteristic with the gate voltage as a parameter, the gate voltage being 2, 3, 4, 5 and 6 V. FIG. 18, on the other hand, is a voltage-current characteristic of MOS transistor of the same characteristic as shown in FIG. 17 with its gate electrode floating. As may be apparent from FIGS. 17 and 18, when the gate electrode floats, the drain current is of the same level as when a gate voltage of over 6 V is applied.

FIG. 19 is a voltage-current characteristic when a p-n diode with an n+-type diffusion layer of dimensions 10 μm×10 μm is connected to the gate electrode of the MOS transistor formed on the p-type substrate, this gate electrode being under floating condition. As may be apparent from FIG. 19, when the diode consisting of the substrate and the diffusion layer is connected to the gate electrode which is under the floating condition, there is substantially no drain current.

The present invention is not by any means limited to the particular embodiments described above. For example, although the description was made with reference to a case wherein the fuses were formed at two locations of one address bus and one data bus, respectively, they may be formed at more than two locations of one bus. Further, although the description was made with reference to a case wherein four MOS transistors were formed for the respective memory cells, they are not limited to four in number, but need only be 2 or more. However, the memory device tends to be defective less frequently when the number of the MOS transistors is great.

According to the present invention, degradation in the yield due to defects in the mask or contamination introduced during the manufacturing process may be prevented. Furthermore, a memory device can be obtained which is capable of preventing degradation of the picture quality of the reproduced picture when used as a panel type display device such as an LCD display panel.

In the memory device as shown in FIG. 1A, the memory cells 1 are disposed on the wafer (substrate), and the data bus driver circuit 34 for generating the video signals (data) and the address bus driver circuit 35 for generating the scanning signals (address signals) are also disposed on the wafer. When a disorder is caused in part of the data bus driver circuit 34 and/or the address bus driver circuit 35, the memory device is rendered inoperative even if the respective memory cells 1 are normal.

When defects are present in the mask or contamination is introduced during the manufacturing process for some reason, the data bus driver circuit 34 and the address bus driver circuit 35 also becomes defective. A case is now considered wherein a liquid crystal panel with the picture elements of 256×256 are arranged at a 300 micron pitch in the form of an array. The yields for the data bus driver circuit 34 and the address bus driver circuit 35 may be calculated by utilizing the equation for obtaining the yield of LSI.

Such calculations are performed in a manner similar to the yield calculations of the following items described in the background:
1. Yield of address bus driver circuit
2. Yield of data bus driver circuit
3. Yield of the common part The calculated results only will be shown here. The yield $Y_B$ of the circuit 34 becomes about 0.659, that is, 65.9%, and the yield $Y_A$ of the circuit 35 becomes about 0.645, that is, 64.5%. The yield Y for both the data bus driver circuit 34 and the address bus driver circuit 35 being non-defective may be calculated as follows:

$$Y = Y_A \times Y_B = 0.645 \times 0.659 \approx 0.425 (42.5\%) \qquad (27)$$

As may be understood from the above results, the yield of the memory device as a whole remains as low as 42.5% with the conventional device even when all of the respective memory cells are non-defective. Thus, one out of two devices is defective. Thus, the cost of the product tends to be increased.

FIG. 20 shows still another embodiment of the present invention. The same numerals indicate the same parts as in FIG. 1A and the detailed description thereof is omitted. In the memory device shown in FIG. 20, a pair of data bus driver circuits $34_1$ and $34_2$ for generating same video signals in synchronism with each other are formed at both ends of the group of data buses B1 to Bn. The video signals generated by the data bus driver circuit $34_1$ are supplied to the group of data buses from the lower end of the group of data buses B1 to Bn, and the video signals generated by the data bus driver circuit $34_2$ are supplied to the group of data buses from the upper end of the group of data buses B1 to Bn. Similarly, a pair of address bus driver circuits $35_1$ and $35_2$ for generating the same scanning signals in synchronism with each other are formed at both ends of the group of address buses A1 to Am. The scanning signals generated by the address bus driver circuit $35_1$ are supplied to the group of address buses from the right end of the group of address buses A1 to Am, and the scanning signals generated by the address bus driver circuit $35_2$ are supplied to the group of address buses from left end of the group of address buses A1 to Am.

Each of the data bus driver circuits $34_1$ and $34_2$ are divided into a common part S and a non-common part P according to the circuit configuration. The common part S is the circuit part which is common to all the respective data buses B and comprises, for example, a shift register. The non-common part P is a group of circuit parts which are formed individually for the data buses B and comprises a plurality of data latch circuits to which are supplied the output signals from the common part S, an output buffer circuit and so on. The non-common parts P are formed in blocks for each pair of data buses, such as P1, . . . Pn/2, and each of the blocks are operable independently of the others. The respective blocks may be set to the condition under which the data may be outputted (operative condition) or to inoperative condition, that is, the output circuit is at a high impedance. Similarly, each of the pair of address buses $35_1$ and $35_2$ may be roughly divided into a common part S and a non-common part P. The non-common parts P are the collective body of circuitrys formed individually for the address buses A. The non-common parts P are formed in blocks for each two address buses, such as block P1, . . . Pm/2. These blocks P1, . . . Pm/2 are capable of being set to be under operative or inoperative condition independently of each other.

With the memory device of the construction described above, immediately after the manufacture, all of the blocks P1, . . . Pn/2 of the circuit $34_1$ which is one of the pair of the data bus driver circuits $34_1$ and $34_2$ are set to be operative, and all of the blocks P1, . . . Pm/2 of the circuit $35_1$ which is one of the pair of address bus circuits $35_1$ and $35_2$ are set to be operative. After the manufacture, all of the blocks P1, . . . Pn/2 of the data bus driver circuit $34_1$ and the blocks P1, . . . Pm/2 the address bus circuit $35_1$ set under the operative condition are tested. When defective blocks are detected by this test, the defective blocks are set under the inoperative condition and the corresponding blocks of the data bus driver circuit $34_2$ and the address bus driver circuit $35_2$ which are the other blocks of the pairs are rendered operative. As a result, the respective memory cells 1 are driven by either of the paired blocks P1, . . . Pn/2 of the pair of data bus driver circuits $34_1$ and $34_2$ formed at both ends of the group of data buses B1 to Bn which are non-defective. They are also driven by either of the paired blocks P1, . . . Pm/2 of the pair of address bus driver circuits $35_1$ and $35_2$ formed at both ends of the group of address buses A1 to Am which are non-defective.

When the detect of the common part S of the data bus driver circuit $34_1$ or the address bus driver circuit $35_1$ is found after the manufacture, the memory cells 1 may be driven normally by using the other data bus driver circuit $34_2$ or the address bus driver circuit $35_2$.

The yield obtainable with the device of the present invention will be calculated. The conditions are the same as those of the conventional case; the number of the memory cells is $256 \times 256$, and they are arranged at a 300 micron pitch.

The yield $Y_B$ of the data bus driver circuit $34_1$ or $34_2$ is 0.659 as in the conventional case, the yield $Y_{BS}$ of the common part S is 0.9045, and the yield $Y_{BP}$ of the non-common part P is 0.729. The yield $Y_A$ of the address bus driver circuit $35_1$ or $35_2$ is similarly 0.645, the yield $Y_{AS}$ of the common part S is 0.846, and the yield $Y_{AP}$ of the non-common part P is 0.762.

The yield $Y_B^*$ of the data bus driver circuits $34_1$ and $34_2$ and the yield $Y_A^*$ of the address bus driver circuits $35_1$ and $35_2$, each of the memory device of the present invention, may be obtained as follows:

$$Y_B^* = [1-\{1-Y_{BP}^{1/N}\}^2]^N \cdot Y_{BS}^2 + 2 \cdot Y_{BS}\{1-Y_{BS}\} \cdot Y_{BP} \qquad (28)$$

$$Y_A^* = [1-\{1-Y_{AP}^{1/M}\}^2]^M \cdot Y_{AS}^2 + 2 \cdot Y_{AS}\{1-Y_{AS}\} \cdot Y_{AP} \qquad (29)$$

where N is the number of blocks for each of the data bus driver circuit $34_1$ and $34_2$ (N=n/2), and M is the number of blocks of each of the address bus driver circuits $35_1$ and $35_2$ (N=m/2).

When N=M=4, $Y_B^*$ and $Y_A^*$ become $Y_B^*=0.925$ and $Y_A^*=0.902$, respectively. Thus, the yield $Y^*$ for all of the bus driver circuits may be obtained as follows:

$$Y^* = Y_B^* \times Y_A^* \approx 0.834 \ (83.4\%) \qquad (30)$$

The yield reaches as high as 83.4% as compared with the conventional yield of the 42.5% for the bus drivers, and the diffence between the two is obvious. The improvements in the yield contribute to reduction of the manufacturing cost.

FIG. 21 shows part of the respective blocks of the address bus drivers $35_1$ and $35_2$. As shown in the figure, the output end of the respective blocks comprises two tristate buffer circuits 60 and 61. When control signal C is at high level, the output circuits of the tristate buffer circuits both become high impedance circuits, so that the associated blocks are set in the inoperative condition. When the control signal C is at low level, respective input signals X1 and X2 are directly outputted, and the associated blocks are rendered operative. FIG. 22 shows an example of the circuit configuration of the tristate buffer circuit 60 or 61 comprising four MOS transistors 71 to 74 and one inverter 75.

The common part of the address bus driver circuit may comprise a shift register (not shown), and the independent part thereof may comprise output buffers (not shown). The on/off operation of the signals to the address buses may be accomplished by circuitry as shown in FIGS. 21 and 22.

The common part and the independent part of the data bus driver circuit may be formed in a construction as shown in FIGS. 9 and 10 of U.S. Pat. No. 3,826,360. The on/off operations of the signals to the data buses may be accomplished by a conventional analog gate circuit. For example, on/off operation of the data bus signals may be accomplished with FET switches whose drain-source paths are rendered conductive or nonconductive according to the gate potential.

The present invention is not limited to the particular embodiments described above. For example, in the above embodiments, description was made with reference to a case in which either of the pair of the blocks in each of the pair of data bus driver circuits $34_1$ and $34_2$ and either of the pair of address bus driver circuits $35_1$ and $35_2$ are set operative. However, when the data bus and/or the address bus is disconnected, both corresponding pairs of blocks may be set to be operative so that the group of memory cells having a disconnection may operate normally. Further, the description was with respect to the case where two data buses and two address buses were formed in the form of blocks for the respective non-common parts P. However, they may be formed in blocks of 2 or more.

In summary, the present invention provides a memory device which is capable of preventing degradation in the yield due to defects in a mask or contamination introduced during the manufacturing process, and which is capable of reducing the manufacturing cost.

What is claimed is:

1. A memory device comprising:
   (a) a plurality of memory cells arranged in a matrix form;
   (b) paired address buses connected to said memory cells and forming respective rows of said matrix;
   (c) data buses connected to said memory cells and forming respective columns of said matrix; and
   (d) bridge means formed in said paired address buses for connecting one with the other of said paired address buses.

2. A memory device comprising:
   (a) a plurality of memory cells arranged in a matrix form;
   (b) address buses connected to ssaid memory cells and forming respective rows of said matrix;
   (c) paired data buses connected to said memory cells and forming respective columns of said matrix; and
   (d) bridge means formed in said paired data buses for connecting one with the other of said paired data buses.

3. A memory device comprising:
   (a) a plurality of memory cells arranged in a matrix form;
   (b) paired address buses connected to said memory cells and forming respective rows of said matrix;
   (c) paired data buses connected to said memory cells and forming respective columns of said matrix; and
   (d) bridge means formed in said paired address buses and in said paired data buses for connecting one with the other of said paired address buses and data buses.

4. A memory device of claim 1, wherein
   test pads are disposed for said address buses for testing whether or not said address buses form an open circuit and whether or not adjacent buses are short-circuited.

5. A memory device of claim 2, wherein
   test pads are disposed for said data buses for testing whether or not said data buses form an open circuit and whether or not adjacent buses are short-circuited.

6. A memory device of claim 3, wherein
   test pads are disposed for said address buses and said data buses for testing whether or not said address buses and said data buses form an open circuit and whether or not adjacent buses are short-circuited.

7. A memory device of claim 4, further comprising:
   (e) fuse means disposed between said address buses and said test pads for electrically interrupting said buses as needed.

8. A memory device of claim 5, further comprising:
   (e) fuse means disposed between said data buses and said test pads for electrically interrupting said buses as needed.

9. A memory device of claim 6, further comprising:
   (e) fuse means disposed at least between said address buses and said test pads or between said data buses and said test pads for electrically interrupting said buses as needed.

10. A memory device of claim 1, 4 or 7, further comprising:
    (f) address bus driving means for driving said address buses, said address bus driving means being formed in the same substrate together with said memory cells, said address buses, said data buses, and said bridge means.

11. A memory device of claim 2, 5 or 8, further comprising:
    (f) data bus driving means for driving said data buses, said data bus driving means being formed in the same substrate together with said memory cells, said address buses, said data buses, and said bridge means.

12. A memory device of claim 3, 6 or 9, further comprising:
    (f) address bus driving means for driving said address buses; and
    (g) data bus driving means for driving said data buses;
    wherein said memory cells, said address buses, said data buses, said bridge means, said address bus driving means and said data bus driving means are formed on the same substrate.

13. A memory device of claim 3, 6 or 9, wherein said memory cell includes:
    a capacitor electrode insulated from a substrate;
    a first transistor whose gate electrode is connected to one of said paired address buses, a first electrode of said first transistor being connected to one of said paired data buses, and a second electrode of said first transistor being connected to said capacitor electrode; and
    a second transistor whose gate electrode is connected to the other of said paired address buses, a first electrode of said second transistor being connected to the other of said paired data buses, and a second electrode of said second transistor being connected to said capacitor electrode.

14. A memory device of claim 13, wherein said memory cell further includes:
    a third transistor whose gate electrode is connected to said one of said paired address buses, a first electrode of said third transistor being connected to said other of said paired data buses, and a second electrode of said third transistor being connected to said capacitor electrode.

15. A memory device of claim 13, wherein said memory cell further includes:
    a fourth transistor whose gate electrode is connected to said other of said paired address buses, a first electrode of said fourth transistor being connected to said one of said paired data buses, and a second electrode of said third transistor being connected to said capacitor electrode.

16. A memory device of claim 13, wherein said memory cell further includes:
    a third transistor whose gate electrode is connected to said one of said paired address buses, a first electrode of said third transistor being connected to said other of said paired data buses, and a second electrode of said third transistor being connected to said capacitor electrode; and
    a fourth transistor whose gate electrode is connected to said other of said paired address buses, a first electrode of said fourth transistor being connected to said one of said paired data buses, and a second electrode of said third transistor being connected to said capacitor electrode.

17. A memory device of claim 12, wherein said memory cell includes:

a capacitor electrode insulated from said substrate;

a first transistor whose gate electrode is connected to one of said paired address buses, a first electrode of said first transistor being connected to one of said paired data buses, and a second electrode of said first transistor being connected to said capacitor electrode; and a second transistor whose gate electrode is connected to the other of said paired address buses, a first electrode of said second transistor being connected to the other of said paired data buses, and a second electrode of said second transistor being connected to said capacitor electrode.

18. A memory device of claim 17, wherein said memory cell further includes:

a third transistor whose gate electrode is connected to said one of said paired address buses, a first electrode of said third transistor being connected to said other of said paired data buses, and a second electrode of said third transistor being connected to said capacitor electrode.

19. A memory device of claim 17, wherein said memory cell further includes:

a fourth transistor whose gate electrode is connected to said other of said paired address buses, a first electrode of said fourth transistor being connected to said one of said paired data buse, and a second electrode of said third transistor being connected to said capacitor electrode.

20. A memory device of claim 17, wherein said memory cell further includes:

a third transistor whose gate electrode is connected to said one of said paired address buses, a first electrode of said third transistor being connected to said other of said paired data buses, and a second electrode of said third transistor being connected to said capacitor electrode; and a fourth transistor whose gate electrode is connected to said other of said paired address buses, a first electrode of said fourth transistor being connected to said one of said paired data buses, and a second electrode of said third transistor being connected to said capacitor electrode.

21. A memory device comprising:
(a) a plurality of memory cells arranged in a matrix form;
(b) paired address buses connected to said memory cells and forming respective rows of said matrix;
(c) data buses connected to said memory cells and forming respective columns of said matrix; and
(d) electrode pads connected to at least one of both ends of said each address bus; and
(e) bus driving means having output pads to be connected to said respective rows for driving said rows;
wherein said electrode pad connected to said address bus at the non-defective side of said paired address buses of said respective rows is connected to the corresponding output pad of said bus driving means.

22. A memory device comprising:
(a) a plurality of memory cells arranged in a matrix form;
(b) address buses connected to said memory cells and forming respective rows of said matrix;
(c) paired data buses connected to said memory cells and forming respective columns of said matrix;
(d) electrode pads connected to at least one of both ends of said each data bus; and
(e) bus driving means having output pads to be connected to said respective columns for driving said columns;
wherein said electrode pad connected to said data bus at the non-defective side of said paired data buses of said respective columns is connected to the corresponding output pad of said bus driving means.

23. A memory device comprising:
(a) a plurality of memory cells arranged in a matrix form;
(b) paired address buses connected to said memory cells and forming respective rows of said matrix;
(c) paired data buses connected to said memory cells and forming respective columns of said matrix;
(d) address electrode pads connected to at least one of both ends of said each address bus;
(e) data electrode pads connected to at least one of both ends of said each data bus;
(f) address bus driving means having output pads connected to said respective rows for driving said rows; and
(g) data bus driving means having output pads connected to said respective columns for driving said columns;
wherein said address electrode pad connected to said address bus at the non-defective side of said paired address buses of said respective rows is connected to the corresponding output pad of said address bus driving means; and
wherein said data electrode pad connected to said data bus at the non-defective side of said paired data buses of said respective columns is connected to the corresponding output pad of said data bus driving means.

24. A memory device of claim 23, wherein said memory cell includes:

a capacitor electrode insulated from a substrate;

a first transistor whose gate electrode is connected to one of said paired address buses, a first electrode of said first transistor being connected to one of said paired data buses, and a second electrode of said first transistor being connected to said capacitor electrode; and a second transistor whose gate electrode is connected to the other of said paired address buses, a first electrode of said second transistor being connected to the other of said paired data buses, and a second electrode of said second transistor being connected to said capacitor electrode.

25. A memory device of claim 24, wherein said memory cell further includes:

a third transistor whose gate electrode is connected to said one of said paired address buses, a first electrode of said third transistor being connected to said other of said paired data buses, and a second electrode of said third transistor being connected to said capacitor electrode.

26. A memory device of claim 24, wherein said memory cell further includes:

a fourth transistor whose gate electrode is connected to said other of said paired address buses, a first electrode of said fourth transistor being connected to said one of said paired data buses, and a second electrode of said third transistor being connected to said capacitor electrode.

27. A memory device of claim 24, wherein said memory cell further includes:
a third transistor whose gate electrode is connected to said one of said paired address buses, a first electrode of said third transistor being connected to said other of said paired data buses, and a second electrode of said third transistor being connected to said capacitor electrode; and
a fourth transistor whose gate electrode is connected to said other of said paired address buses, a first electrode of said fourth transistor being connected to said one of said paired data buses, and a second electrode of said third transistor being connected to said capacitor electrode.

28. A memory device comprising:
(a) a plurality of memory cells arranged in a matrix form;
(b) paired address buses connected to said memory cells and forming respective rows of said matrix;
(c) data buses connected to said memory cells and forming respective columns of said matrix;
(d) fuse means disposed at two or more locations in a path of said each address bus for electrically interrupting said bus path as needed; and
(e) means disposed between said address bus interposed between said fuse means at two locations and a predetermined potential part for preventing floating of said address bus.

29. A memory device comprising:
(a) a plurality of memory cells arranged in a matrix form;
(b) address buses connected to said memory cells and forming respective rows of said matrix;
(c) paired data buses connected to said memory cells and forming respective columns of said matrix;
(d) fuse means disposed at two or more locations in a path of said each data bus for electrically interrupting said bus path as needed; and
(e) means disposed between said data bus interposed between said fuse means at two locations and a predetermined potential part for preventing floating of said data bus.

30. A memory device comprising:
(a) a plurality of memory cells arranged in a matrix form;
(b) paired address buses connected to said memory cells and forming respective rows of said matrix;
(c) paired data buses connected to said memory cells and forming respective columns of said matrix;
(d) first fuse means disposed at two or more locations in a path of said each address bus for electrically interrupting said bus path as needed;
(e) second fuse means disposed at two or more locations in a path of said each data bus for electrically interrupting said bus path as needed; and
(f) means for preventing floating of said address bus and said data bus, disposed between said address bus interposed between said first fuse means at two locations and a predetermined potential part, and disposed between said data bus interposed between said second fuse means at two locations and a predetermined potential part.

31. A memory device of claim 28, wherein said floating preventing means includes:
a unidirectional conduction device which is reversely biased when said address bus is not floating and is forwardly biased when said address bus is going to float for clamping said address bus at a potential substantially the same as said predetermined potential part.

32. A memory device of claim 31, wherein said unidirectional conduction device comprises
a p-n junction diode formed in a semiconductor substrate on which is formed the memory device.

33. A memory device of claim 29, wherein said floating preventing means includes:
a unidirectional conduction device which is reversely biased when said data bus is not floating and is forwardly biased when said data bus is going to float for clamping said data bus at a potential substantially the same as said predetermined potential part.

34. A memory device of claim 33, wherein said unidirectional conduction device comprises
a p-n junction diode formed in a semiconductor substrate on which is formed the memory device.

35. A memory device of claim 30, wherein said floating preventing means includes:
a first unidirectional conduction device which is reversely biased when said address bus is not floating and is forwardly biased when said address bus is going to float for clamping said address bus at a potential substantially the same as said predetermined potential part; and
a second unidirectional conduction device which is reversely biased when said data bus is not floating and is forwardly biased when said data bus is going to float for clamping said data bus at a potential substantially the same as said predetermined potential part.

36. A memory device of claim 35, wherein said first and second unidirectional conduction devices comprise
p-n junction diodes formed in a semiconductor substrate on which is formed the memory device.

37. A memory device of claim 30, 35 or 36, wherein said memory cell includes:
a capacitor electrode insulated from a substrate;
a first transistor whose gate electrode is connected to one of said paired address buses, a first electrode of said first transistor being connected to one of said paired data buses, and a second electrode of said first transistor being connected to said capacitor electrode; and
a second transistor whose gate electrode is connected to the other of said paired address buses, a first electrode of said second transistor being conncted to the other of said paired data buses, and a second electrode of said second transistor being connected to said capacitor electrode.

38. A memory device of claim 37, wherein said memory cell further includes:
a third transistor whose gate electrode is connected to said one of said paired address buses, a first electrode of said third transistor being connected to said other of said paired data buses, and a second electrode of said third transistor being connected to said capacitor electrode.

39. A memory device of claim 37, wherein said memory cell further includes:

a fourth transistor whose gate electrode is connected to said other of said paired address buses, a first electrode of said fourth transistor being connected to said one of said paired data buses, and a second electrode of said third transistor being connected to said capacitor electrode.

40. A memory device of claim 37, wherein said memory cell further includes:

a third transistor whose gate electrode is connected to said one of said paired address buses, a first electrode of said third transitor being connected to said other of said paired data buses, and a second electrode of said third transistor being connected to said capacitor electrode; and a fourth transistor whose gate electrode is connected to said other of said paired address buses, a first electrode of said fourth transistor being connected to said one of said paired data buses, and a second electrode of said third transistor being connected to said capacitor electrode.

41. A memory device comprising:
(a) a plurality of memory cells arranged in a matrix form;
(b) address buses connected to said memory cells and forming respective rows of said matrix;
(c) data buses connected to said memory cells and forming respective columns of said matrix; and
(d) paired address bus driver means connected to both ends of said address buses for driving said address buses, said paired driver means including paired driver blocks connected to both ends of said respective address buses, said paired blocks outputting same address signals to said address bus interposed between said bocks in synchronism with each other.

42. A memory device comprising:
(a) a plurality of memory cells arranged in a matrix form;
(b) address buses connected to said memory cells and forming respective rows of said matrix;
(c) data buses connected to said memory cells and forming respective columns of said matrix; and
(d) paired data bus driver means connected to both ends of said data buses for driving said data buses, said paired driver means including paired driver blocks connected to both ends of said respective data buses, said paired blocks outputting same data signals to said data bus interposed between said blocks in synchronism with each other.

43. A memory device comprising:
(a) a plurality of memory cells arranged in a matrix form;
(b) address buses connected to said memory cells and forming respective rows of said matrix;
(c) data buses conncted to said memory cells and forming respective columns of said matrix;
(d) paired address bus driver means connected to both ends of said address buses for driving said address buses, said paired driver means including paired address bus driver blocks connected to both ends of said respective address buses, said paired blocks outputting same address signals to said address but interposed between said blocks in synchronism with each other; and
(e) paired data bus driver means connected to both ends of said data buses for driving said data buses, said paired driver means including paired data bus driver blocks connected to both ends of said respective data buses, said paired blocks outputting same data signals to said data bus interposed between said blocks in synchronism with each other.

* * * * *